(12) United States Patent
Graettinger et al.

(10) Patent No.: US 7,105,403 B2
(45) Date of Patent: Sep. 12, 2006

(54) DOUBLE SIDED CONTAINER CAPACITOR FOR A SEMICONDUCTOR DEVICE AND METHOD FOR FORMING SAME

(75) Inventors: Thomas M. Graettinger, Boise, ID (US); Marsela Pontoh, Boise, ID (US); Thomas A. Figura, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 93 days.

(21) Appl. No.: 10/628,994

(22) Filed: Jul. 28, 2003

(65) Prior Publication Data

US 2005/0026361 A1   Feb. 3, 2005

(51) Int. Cl.
*H01L 21/8242* (2006.01)
(52) U.S. Cl. .............. 438/243; 438/244; 438/250; 438/254
(58) Field of Classification Search ............... 438/243, 438/244, 250, 254
See application file for complete search history.

(56) References Cited

U.S. PATENT DOCUMENTS

| | | | | |
|---|---|---|---|---|
| 5,126,280 A * | 6/1992 | Chan et al. | ............. | 438/253 |
| 5,150,276 A | 9/1992 | Gonzalez et al. | ............. | 361/313 |
| 5,792,680 A * | 8/1998 | Sung et al. | ............. | 438/210 |
| 6,037,217 A * | 3/2000 | Linliu | ............. | 438/253 |
| 6,107,152 A * | 8/2000 | Derderian | ............. | 438/381 |
| 6,232,197 B1 * | 5/2001 | Tsai | ............. | 438/393 |
| 6,331,460 B1 * | 12/2001 | Kizilyalli et al. | ............. | 438/243 |
| 6,445,023 B1 * | 9/2002 | Vaartstra et al. | ............. | 257/295 |
| 6,635,547 B1 * | 10/2003 | DeBoer et al. | ............. | 438/386 |
| 6,693,015 B1 * | 2/2004 | Carstensen | ............. | 438/306 |
| 6,696,336 B1 * | 2/2004 | DeBoer et al. | ............. | 438/253 |
| 6,737,696 B1 * | 5/2004 | DeBoer et al. | ............. | 257/306 |
| 6,790,725 B1 * | 9/2004 | Coursey | ............. | 438/253 |
| 6,809,918 B1 * | 10/2004 | Carstensen | ............. | 361/306.3 |
| 6,867,093 B1 * | 3/2005 | Marsh et al. | ............. | 438/250 |
| 6,900,107 B1 * | 5/2005 | Marsh | ............. | 438/396 |
| 2003/0166318 A1 * | 9/2003 | Zheng et al. | ............. | 438/239 |
| 2003/0201476 A1 * | 10/2003 | Cheng et al. | ............. | 257/296 |

* cited by examiner

*Primary Examiner*—W. David Coleman
*Assistant Examiner*—Khiem D. Nguyen
(74) *Attorney, Agent, or Firm*—Kevin D. Martin

(57) ABSTRACT

A method for forming a double sided container capacitor comprises forming a first capacitor top plate layer within a recess in a dielectric layer, then forming a first cell dielectric on the first top plate layer. Next, first and second bottom plate layers are formed on the first cell dielectric layer, and a second cell dielectric layer is formed on the second bottom plate layers. Finally, a second top plate layer is formed on the second cell dielectric layer, and the first and second top plate layers are electrically connected using a conductive plug or conductive spacer. An inventive structure formed using the inventive method is also described.

21 Claims, 24 Drawing Sheets

DOUBLE SIDED CONTAINER CAPACITOR FOR A SEMICONDUCTOR DEVICE AND METHOD FOR FORMING SAME

FIELD OF THE INVENTION

This invention relates to the field of semiconductor manufacture and, more particularly, to a double sided container capacitor and a method for forming the capacitor.

BACKGROUND OF THE INVENTION

During the manufacture of semiconductor devices which comprise memory elements, such as dynamic random access memories (DRAMs), static random access memories (SRAMs), and some microprocessors, container capacitors are commonly formed. Container capacitors are well known to allow an increased stored charge over planar capacitors by increasing the surface area on which the charge may be stored.

FIGS. 1–7 depict a conventional method for forming a container capacitor from polysilicon. FIG. 1 depicts a semiconductor wafer substrate assembly 10 comprising the following structures: a semiconductor wafer 12; a plurality of doped source/drain regions 14 within the wafer 12; transistors 16 comprising gate oxide 18, a doped polysilicon control gate 20, silicide 22 such as tungsten silicide which increases conductivity of the control gate 20, and a capping layer 24 often manufactured from silicon nitride. FIG. 1 further depicts silicon nitride spacers 26 which insulate the control gate 20 and silicide 22 from polysilicon pads 28 to which the container capacitors will be electrically coupled. Further depicted in FIG. 1 is shallow trench isolation (STI, field oxide) 30 which reduces unwanted electrical interaction between adjacent control gates; and a thick layer of deposited oxide 32 such as borophosphosilicate glass (BPSG). A patterned photoresist layer 34 defines the location of the container capacitors to be formed. The FIG. 1 structure may further include one or more bit (digit) lines under the BPSG layer or various other structural elements or differences which, for simplicity of explanation, have not been depicted.

The FIG. 1 structure is subjected to an anisotropic etch which removes the exposed portions of the BPSG layer to form a patterned BPSG layer which provides a base dielectric having a recess for the container capacitor. During this etch the polysilicon pads 28 and possibly a portion of capping layer 24 are exposed as depicted in FIG. 2. The remaining photoresist layer is stripped and any polymer (not depicted) which forms during the etch is removed according to means known in the art to provide the FIG. 3 structure.

As depicted in FIG. 4, a blanket polysilicon layer 40 is formed conformal with the deposited oxide layer, and will provide a container capacitor storage node for the completed capacitor. A thick blanket filler material 42, such as photoresist, is formed to fill the containers provided by polysilicon 40. The FIG. 4 structure is then subjected to a planarizing process, such as a chemical planarization, a mechanical planarization, or a chemical mechanical planarization (CMP) step. This process removes portions of the photoresist 42, the polysilicon 40, and usually a portion of the BPSG 32 to result in the FIG. 5 structure.

Next, the BPSG 32 is partially etched with an etch selective to polysilicon (i.e. an etch which minimally etches or, preferably, doesn't etch polysilicon) to result in the structure of FIG. 6. At this point in the process the polysilicon storage nodes (capacitor bottom plates) 40 are only minimally supported. The bottom plates 40 in the FIG. 6 structure each comprise a first region 60 which defines a recess, and a second region 62 which defines an opening to the recess with the first and second regions being continuous, each with the other. In other words, the bottom plate 40 of FIG. 6 defines a receptacle having a rim 62 which defines an opening to the interior of the receptacle. The regions 60, 62 form vertically-oriented sides of the bottom plate, and the sides are electrically-coupled by a horizontally-oriented bottom 64.

Next, a cell dielectric layer 70, for example a layer of high-quality cell nitride, a polysilicon container capacitor top plate 72, and a planar oxide layer such as BPSG 74 are formed according to means known in the art to result in the FIG. 7 structure. This forms a "double sided" capacitor, as both the capacitor cell dielectric 70 and capacitor top plate 72 follow the contours of the majority of both the inside and outside of each container capacitor bottom plate 40. After forming the structure of FIG. 7, wafer processing continues according to means known in the art.

It can be seen at the FIG. 6 structure that conventional processes remove the oxide which supports the capacitor bottom plate. This oxide removal is performed to allow formation of the cell dielectric and capacitor top plate on both sides of the bottom plate to form a double sided capacitor. The structure of FIG. 6 is easily damaged and susceptible to defects such as leaning (caused, for example, during the etch of BPSG 32 of FIG. 5 to result in FIG. 6), toppling, or lifting of the bottom plate. However, it is desirable to form a double sided capacitor to increase the cell capacitance which allows the cell height to be decreased over a single sided capacitor. Limiting this vertical dimension of the cell capacitor is desirable because it sets the depth of the contact level to follow. For example, current etch tool technology can etch contacts to a depth of about 3.0 micrometers (μm) to about 3.5 μm. If the capacitor height causes the contact depth to go beyond the 3.0 μm to 3.5 μm limit, then additional masking layers will be needed. One way to do this is to form a portion of the contact to diffusion areas in the wafer before forming the capacitor, then forming the remaining portion after forming the capacitor. Such a process is complex and adds significantly to device cost.

Another problem which can occur during conventional processing results indirectly from the etch of BPSG layer 32 of FIG. 5 to result in the FIG. 6 structure. During this etch, BPSG over the device periphery (not depicted) is also etched, which forms a step in the oxide between the periphery, where there are no cell capacitors, and the array, where the tops of the cell capacitors are at the original level of the top of BPSG 32. After forming the cell dielectric and top plate, the periphery region must be backfilled with oxide, which is then planarized. The requirement to backfill and planarize results in additional processing steps, which contributes to a further increase in costs.

A method used to form a double sided container capacitor which reduces or eliminates the problems described above, and a structure resulting therefrom, would be desirable.

SUMMARY OF THE INVENTION

The present invention provides a new method which, among other advantages, reduces problems associated with the manufacture of semiconductor devices, particularly problems resulting during the formation of double sided container capacitors. In accordance with one embodiment of the invention an etch stop layer is formed over a semiconductor wafer substrate assembly which includes a contact pad, then an oxide layer and a conductive layer are formed over the etch stop layer. The conductive layer and oxide layer are patterned, which forms a recess in the oxide layer which will receive and define both the bottom and top cell plates for the capacitor, and form a base therefor.

Next, a first conductive conformal layer, which will eventually form part of a container capacitor top plate, is formed on the patterned oxide layer and then spacer etched, with the etch stopping on the etch stop layer. Subsequently, a first cell dielectric layer is formed over the first conductive conformal layer and on the etch stop layer, and a second conductive conformal layer, which will eventually form a part of a bottom plate for the capacitor, is formed over the first cell dielectric layer. The first cell dielectric layer and the second conductive conformal layer are etched using a spacer etch to expose the etch stop layer, then the etch stop layer is etched to expose the contact pad.

A third conformal conductive layer is formed on the second conformal conductive layer and on the contact pad. Because the third conductive layer is conformal, it forms a recess. A protective material is formed within the recess in the third conductive conformal layer, and over the wafer surface, then the structure is planarized which only partially etches the conductive layer initially formed over the base oxide layer. A blanket second cell dielectric layer is formed over the third conductive conformal layer, and a fourth conductive conformal layer, which will form a second part of the capacitor top plate, is formed over the second cell dielectric layer. The second cell dielectric and fourth conductive conformal layers are patterned and the first and fourth conductive conformal layers are electrically coupled through the conductive layer formed over the base oxide layer. The first and fourth conductive conformal layers form the top plate of the capacitor, while the second and third conductive conformal layers form the bottom plate. Wafer processing then continues according to means known in the art to form a semiconductor device.

Advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examining the information herein.

DETAILED DESCRIPTION OF THE PREFERRED EMBODIMENT

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. In addition, the semiconductor need not be silicon-based, but could be based on silicon-germanium, silicon-on-insulator, silicon-on-sapphire, germanium, or gallium arsenide, among others.

Figure 1:
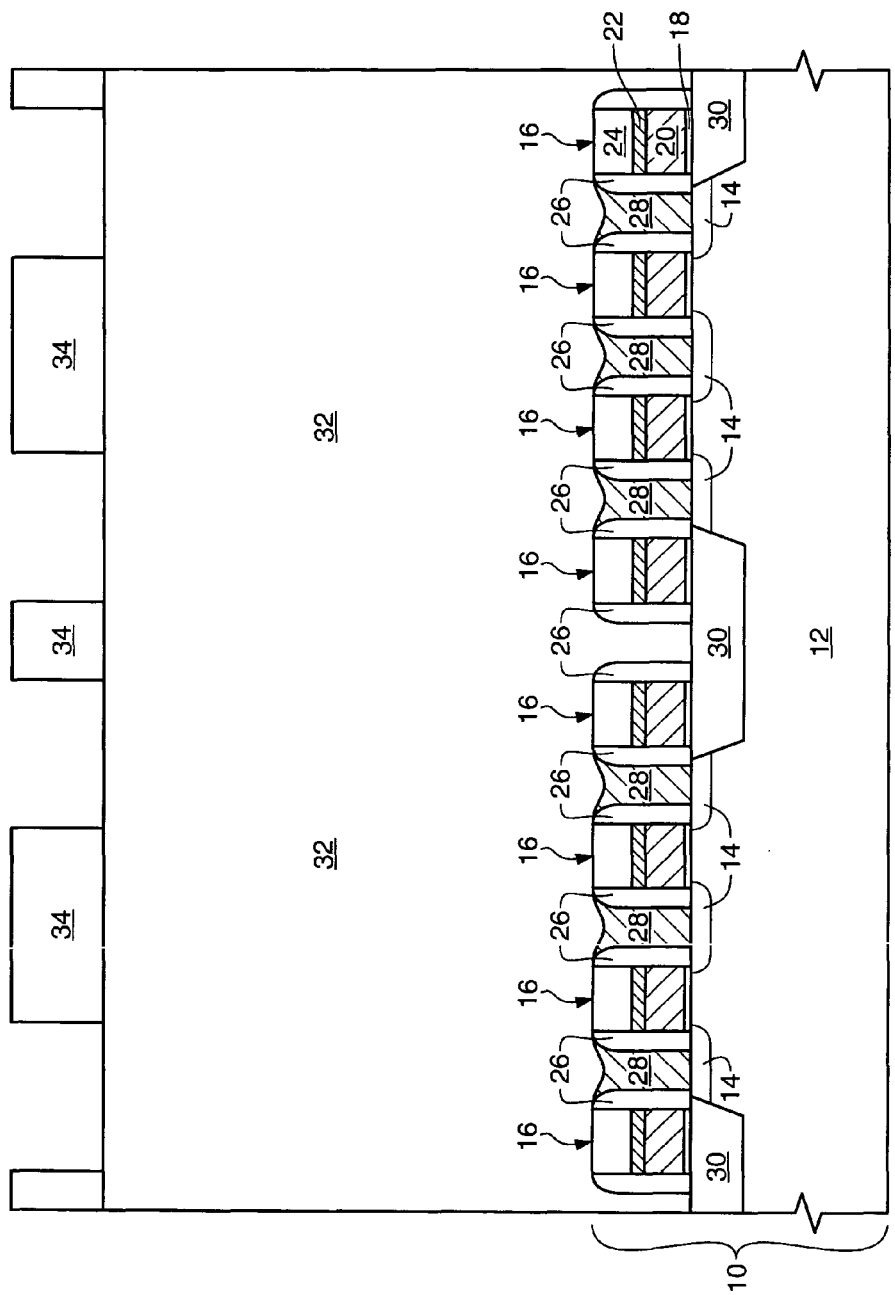
FIGS. 1–7 are cross sections depicting a conventional method for forming a double-sided container capacitor structure.
Figure 2:
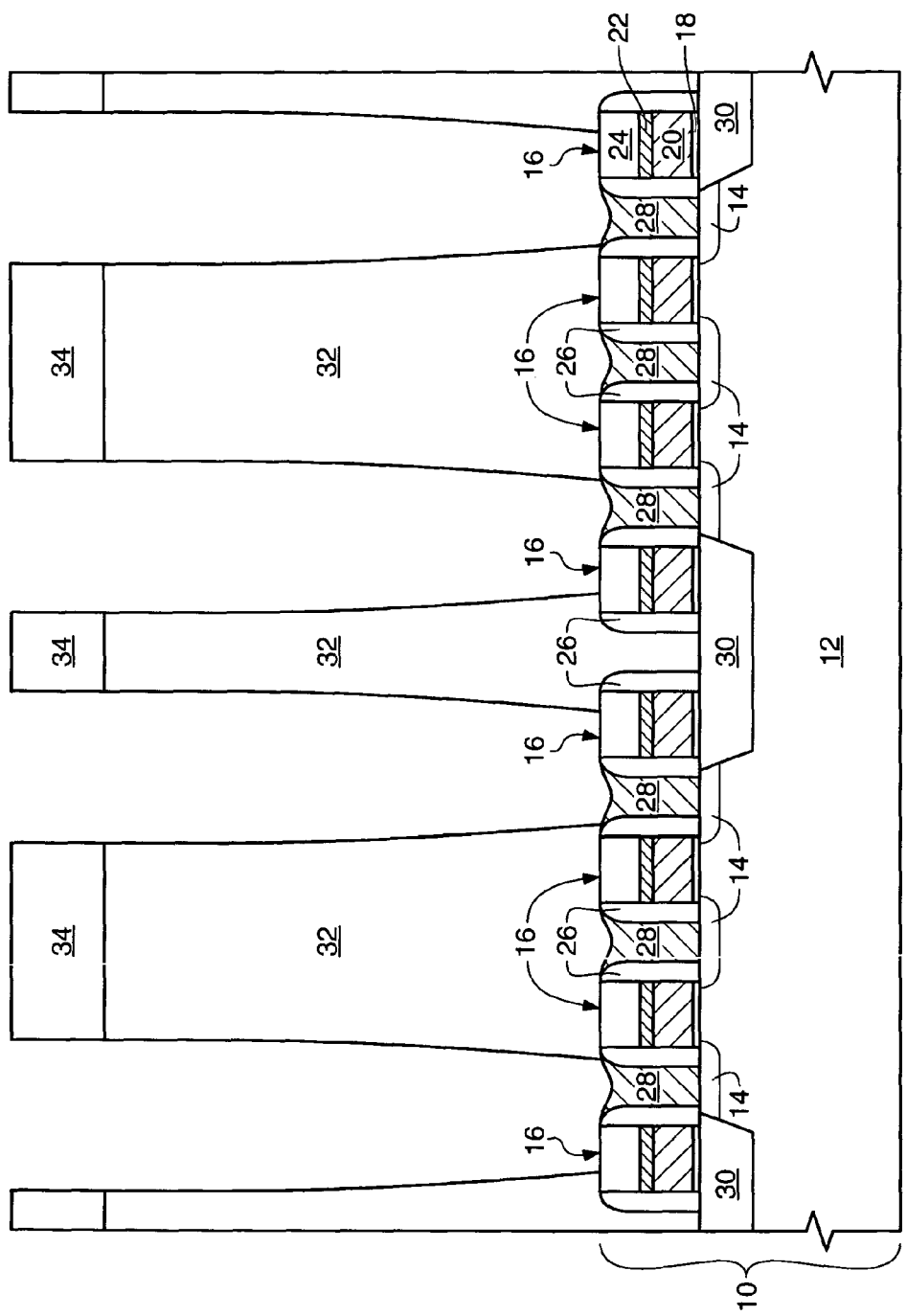
Figure 3:
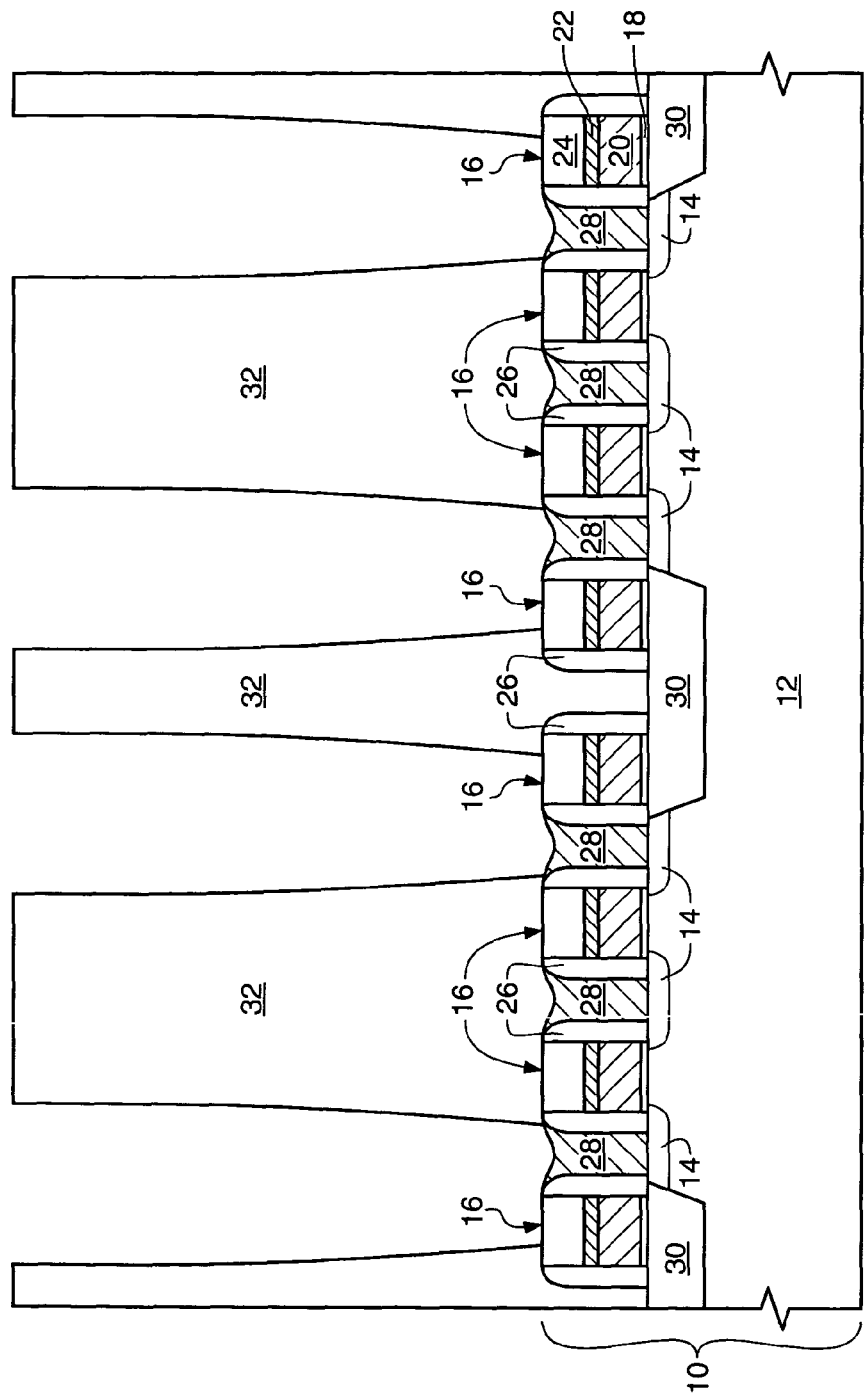
Figure 4:
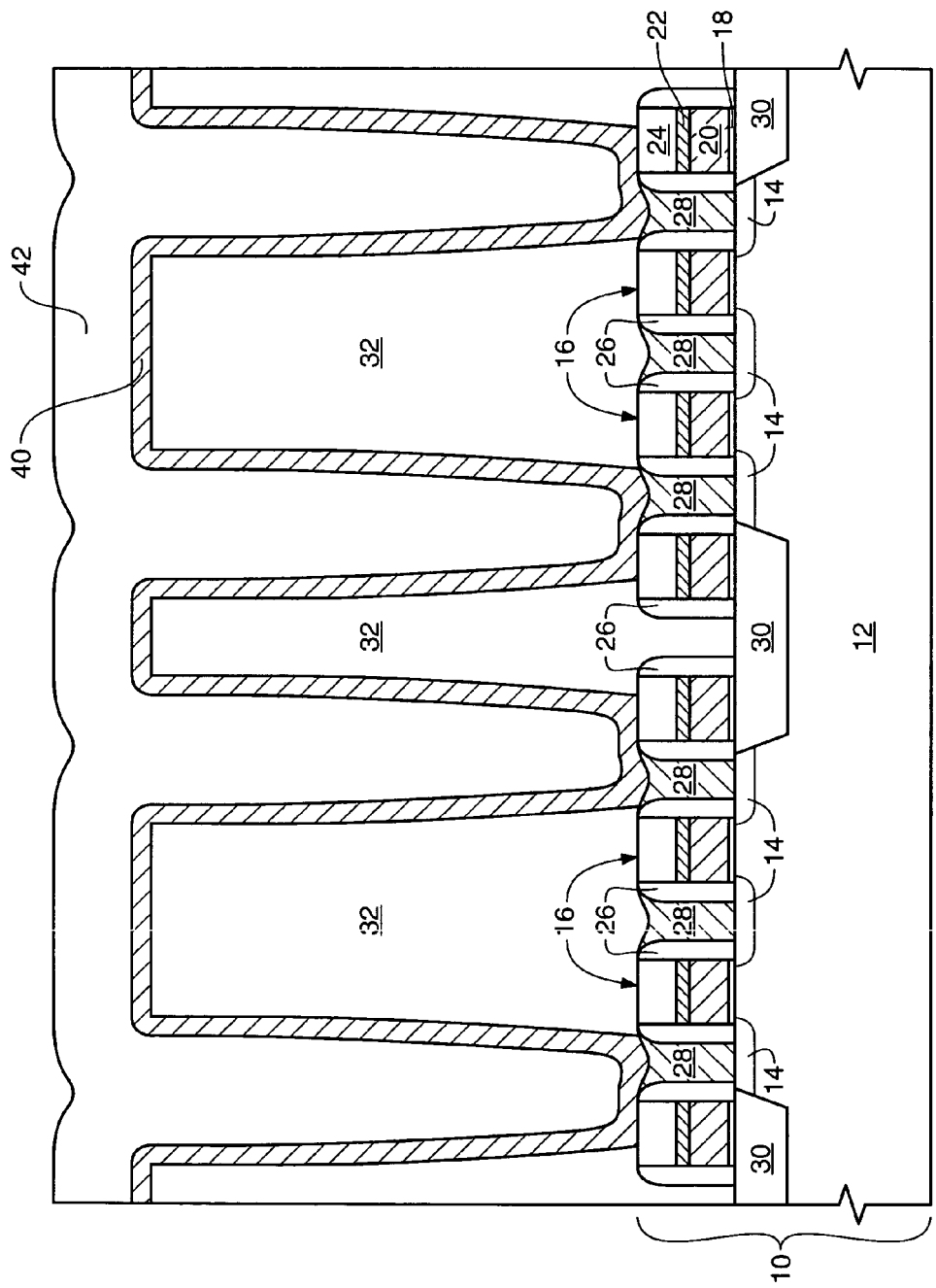
Figure 5:
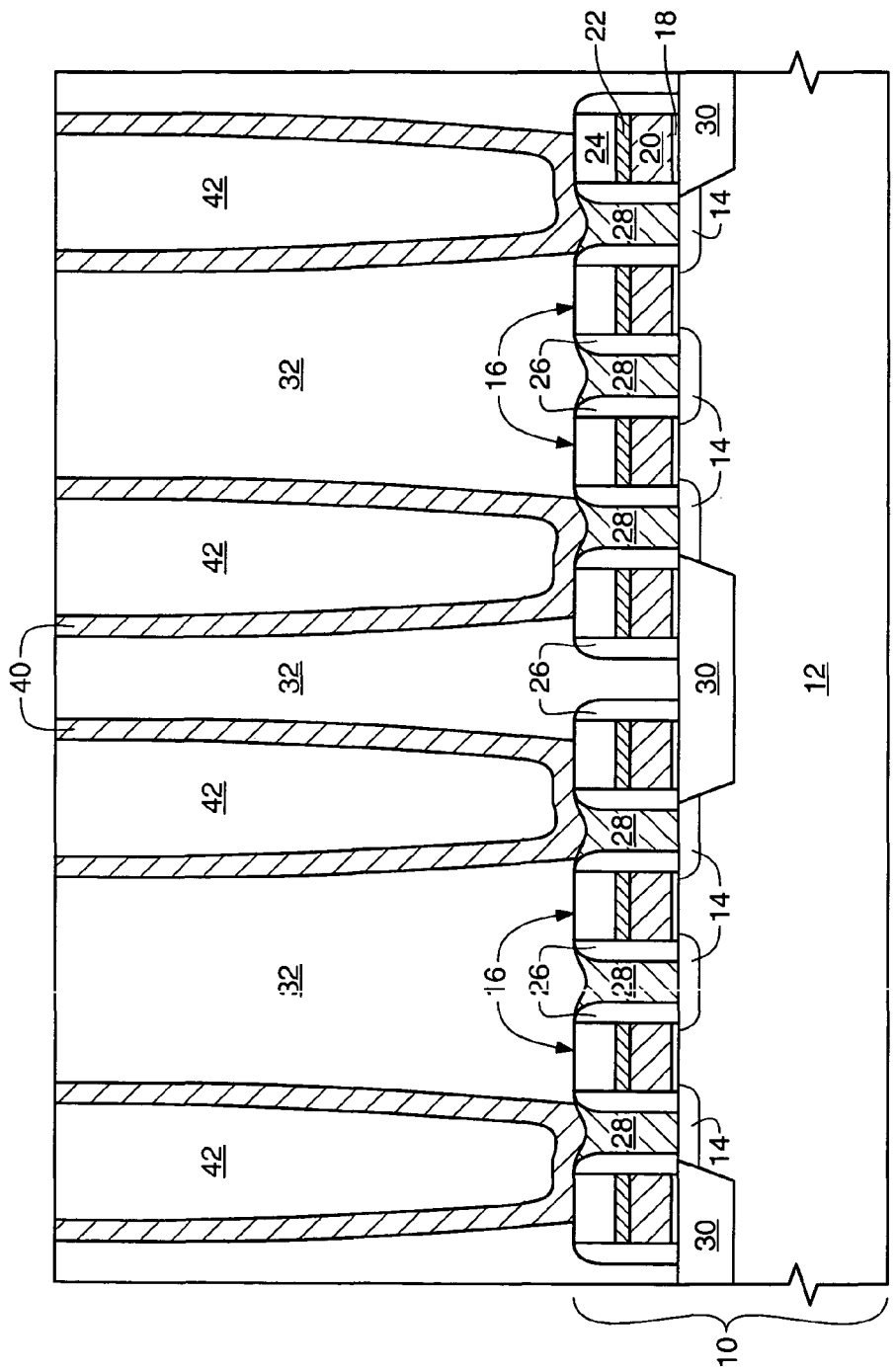
Figure 6:
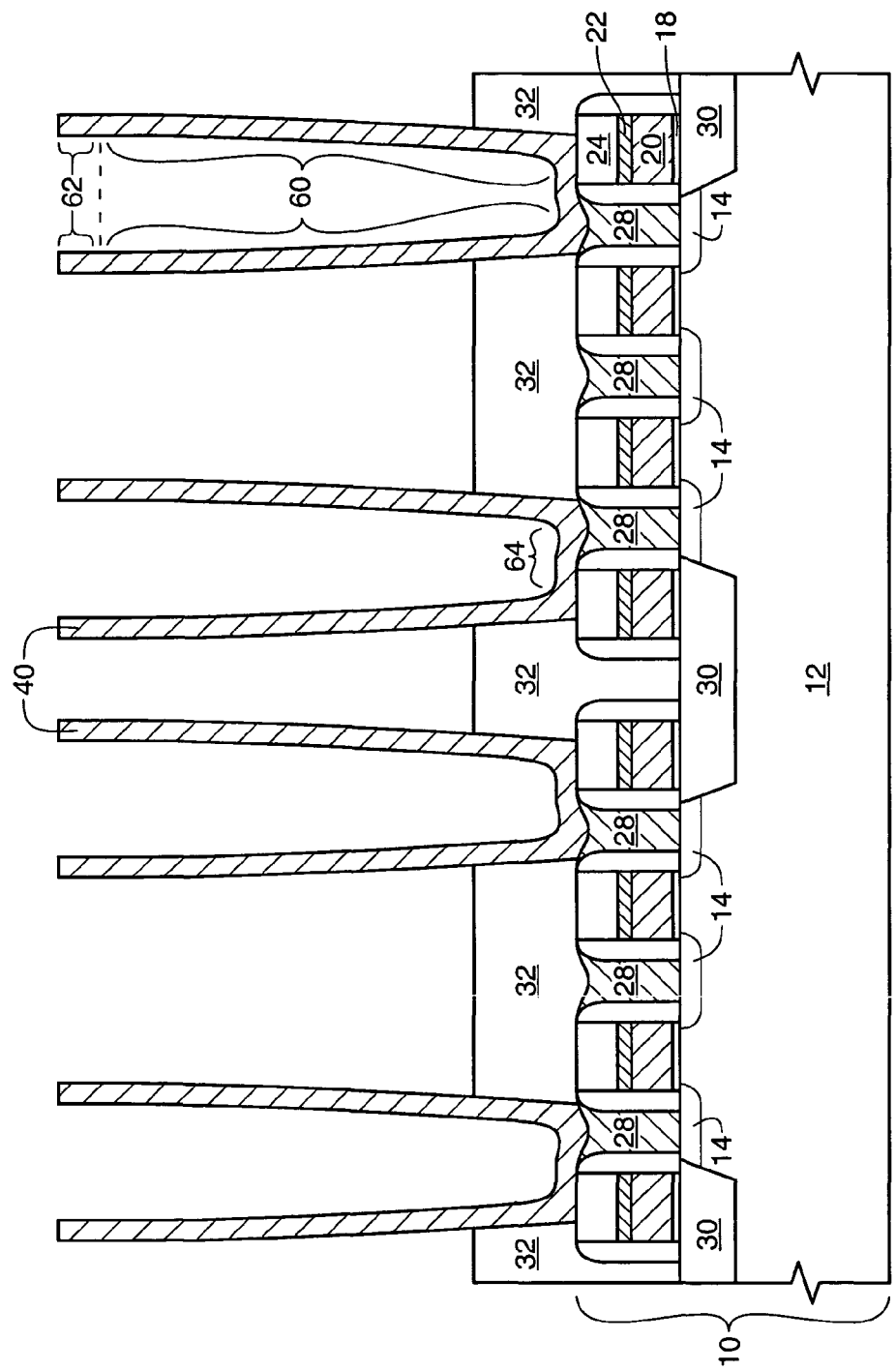
Figure 8:
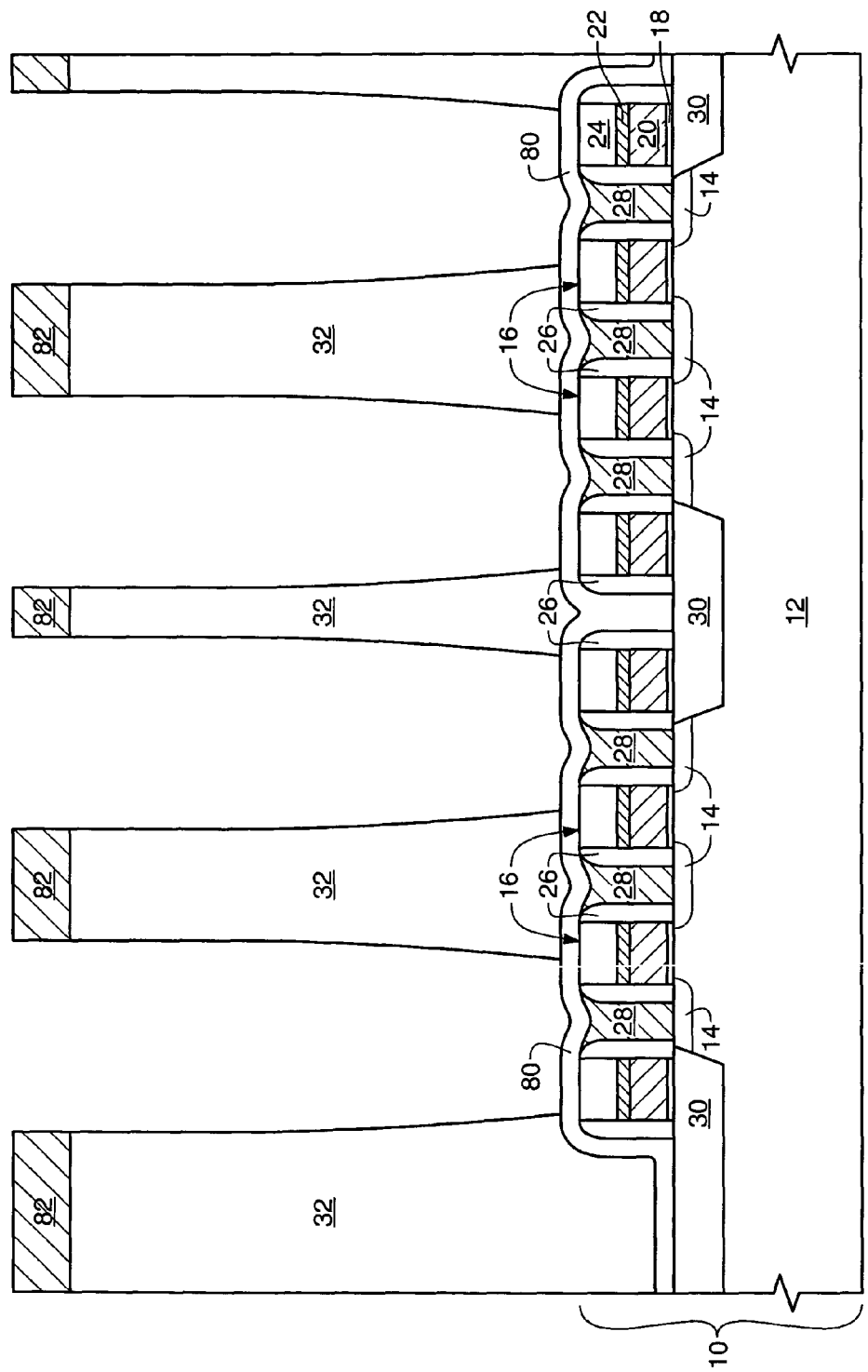
FIGS. 8–21 are cross sections depicting embodiments of the inventive method for forming a double-sided container capacitor structure.

A first embodiment of an inventive method for forming a double-sided container capacitor structure is depicted by the cross sections of FIGS. 8–21. FIG. 8 depicts a structure similar to that of FIG. 2, with the exception of an etch stop layer 80, formed prior to forming oxide layer 32, and a conductive layer 82 formed over dielectric 32 prior to patterning. Layer 80 is a dielectric which will withstand an etch which removes a conductor such at titanium nitride (TiN) and which can be etched selective to a conductor such as titanium nitride (i.e. can be etched while removing none or very little of an exposed conductor such as titanium nitride). A silicon nitride ($Si_3N_4$) layer between about 50 angstroms (Å) and about 500 Å, formed according to means known in the art, would be sufficient for etch stop 80. Conductive layer 82 can comprise a conductively-doped polysilicon layer between about 2,000 Å and about 4,000 Å thick formed according to means known in the art. Conductive layer 82 may also comprise a two or more layers, for example a TiN layer between about 100 Å to about 500 Å thick covered by a silicon dioxide layer between about 500 Å thick to about 2,000 Å thick. While this layer is described in the embodiment below with reference a polysilicon layer, the TiN/$SiO_2$ stack may be used as well.

Figure 9:
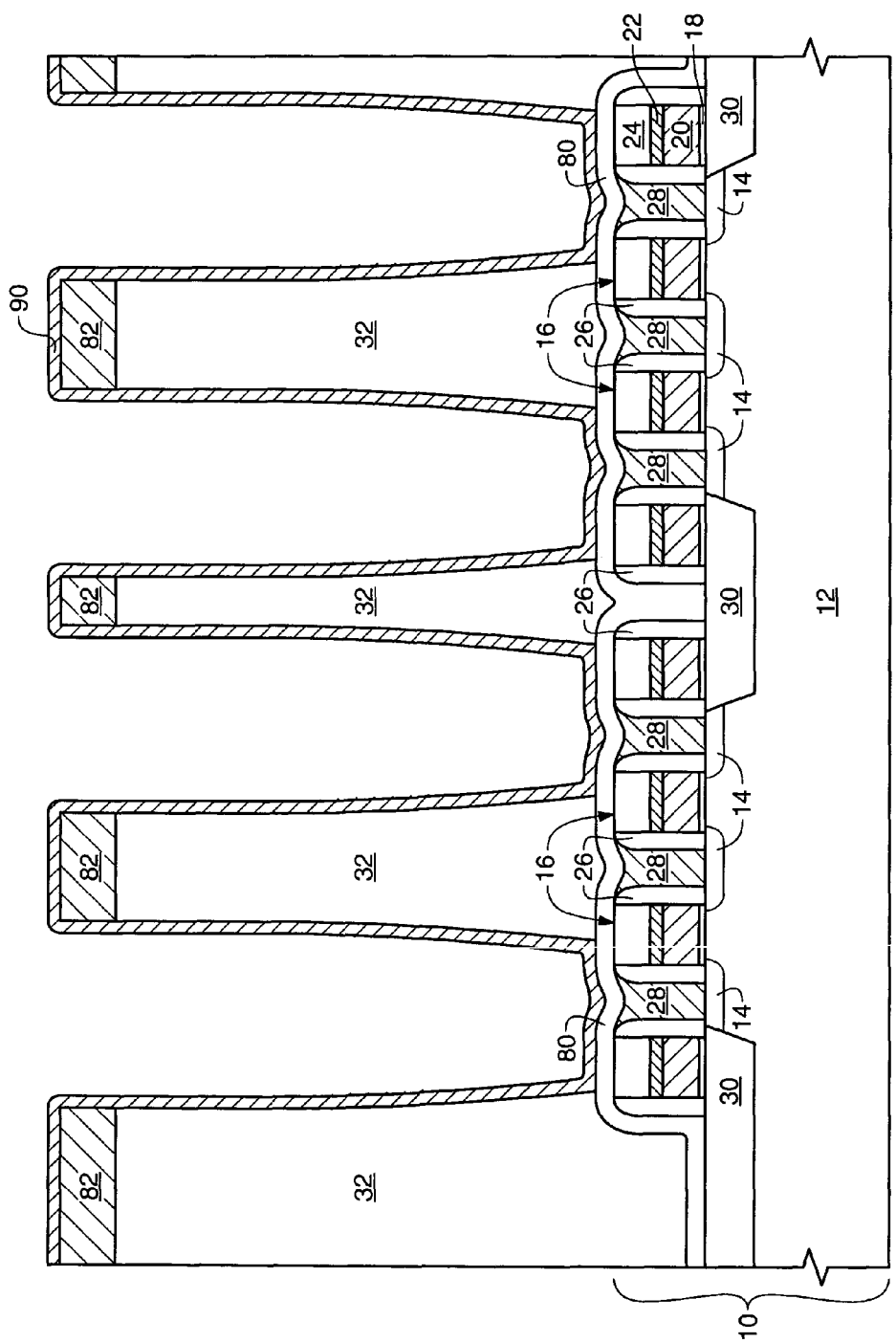

Referring to FIG. 9, a conductive conformal layer 90, such as a titanium nitride layer between about 50 Å and 100 Å thick, is formed over the surface of the FIG. 8 structure. This layer will eventually function as part of the container capacitor top plate. A TiN layer of the specified thickness can be formed using a chemical vapor deposition (CVD) process by flowing titanium tetrachloride ($TiCl_4$) and ammonia ($NH_3$), or, more likely, using atomic layer deposition (ALD). Both CVD and ALD formation of titanium nitride is well known in the art.

After forming the first conformal conductive layer, it is etched using a spacer etch which is selective to silicon nitride etch stop 80. A spacer etch which etches titanium nitride selective to silicon nitride to form titanium nitride spacers includes a plasma etch of nitrogen trifluoride ($NF_3$) and chlorine ($Cl_2$) for a duration of between about 5 seconds and about 20 seconds. This will clear the 50 Å–100 Å layer of titanium nitride from the bottom of the opening in oxide layer 32 to result in the cross-sectional titanium nitride spacers 100 of FIG. 10. This etch may also remove a portion of the thickness from silicon nitride etch stop 80, but some will remain over pad 28. Additionally, a small percentage of the thickness of conductive layer 82 may be etched during this etch, but this will have no detrimental effect on processing or functionality of the device.

Figure 10:
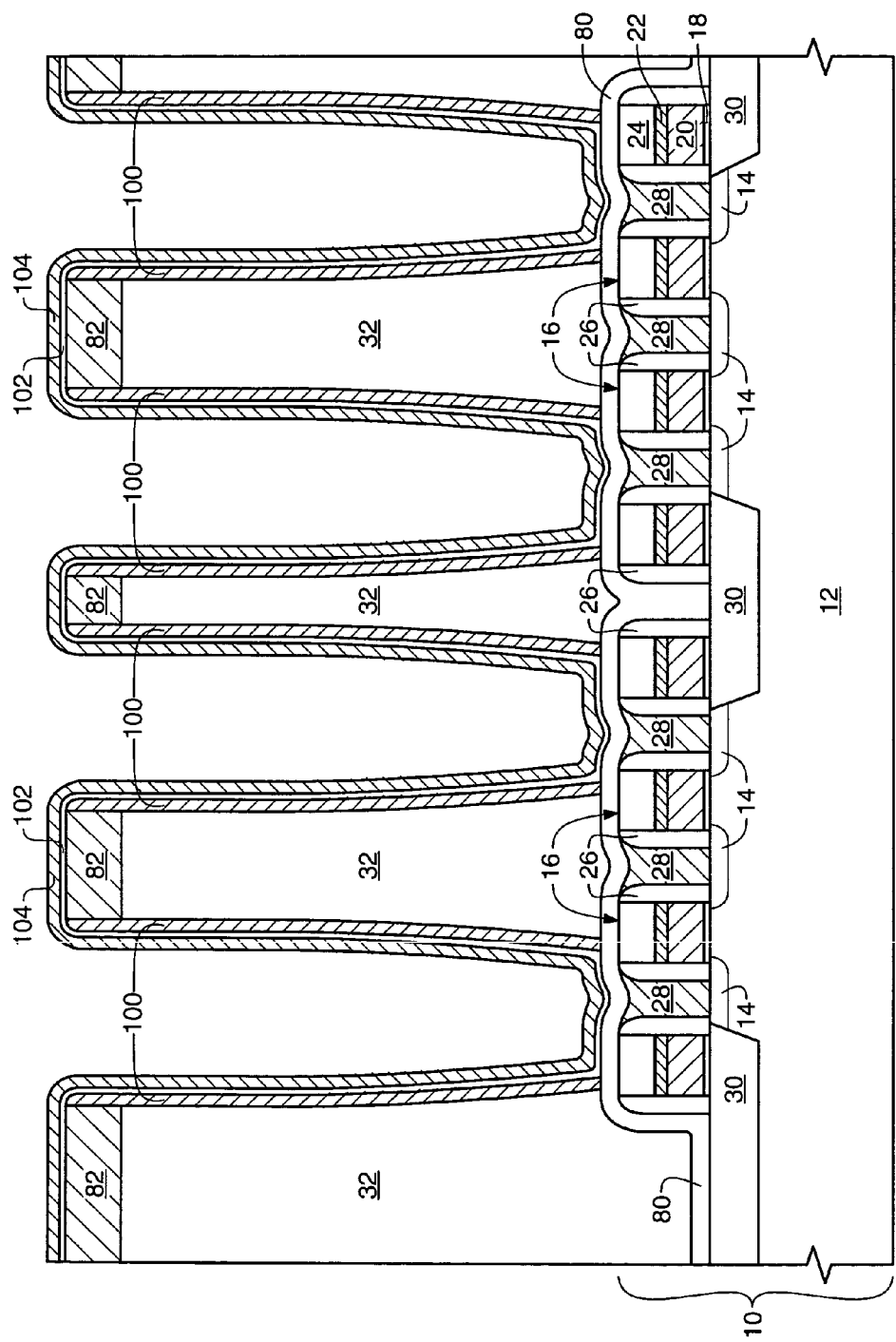

It should be noted that FIG. 10 depicts first and second cross-sectional spacers 100, one on each dielectric sidewall, for each container capacitor. They are first and second "cross-sectional" spacers because in FIG. 10 for example they appear as separate spacers, while one of ordinary skill in the art will appreciate that the two spacers depicted for each container capacitor is in reality one continuous spacer which coats the inside of the opening in dielectric layer 32 (see, for example, FIG. 22). The term "cross-sectional" as used herein indicates that while various features may appear in cross section to be two or more separate features, they may actually be different parts of the same feature.

After etching layer 90 of FIG. 9 to form spacers 100 of FIG. 10, a cell dielectric layer 102, for example aluminum oxide ($Al_2O_3$), and a second conformal conductive layer 104, for example a second titanium nitride layer, is formed as depicted in FIG. 10. An $Al_2O_3$ cell dielectric layer between about 40 Å to about 60 Å can be formed using trimethyl aluminum (TMA) and ozone ($O_3$), TMA and water, or by using a conventional CVD or ALD process. The second conformal conductive layer 104 can be provided using a process as described for the first titanium nitride layer to form a titanium nitride layer about 50 Å thick.

Figure 11:
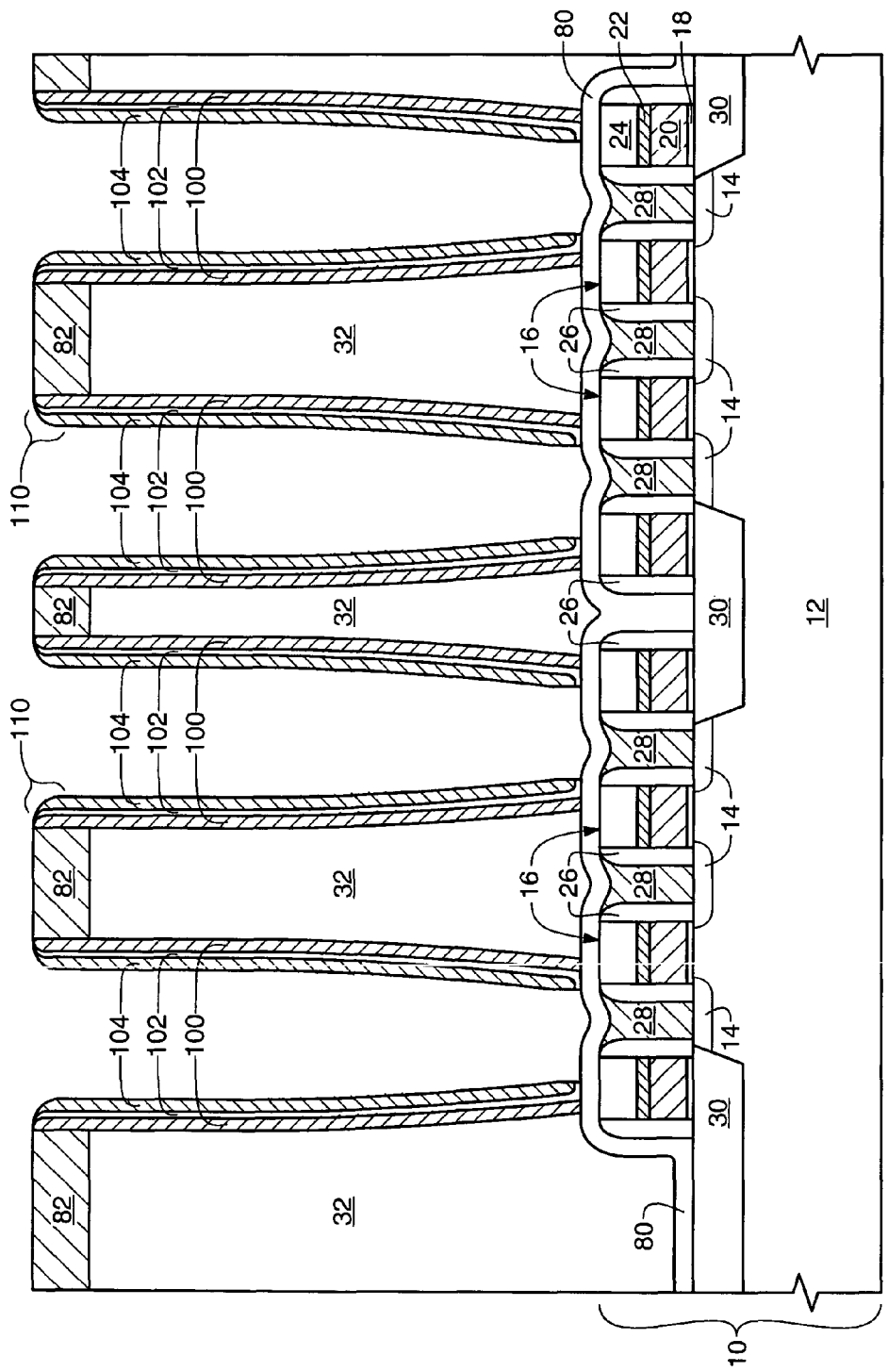

Next, the second conductive conformal layer 104 and cell dielectric layer 102 are etched with a spacer etch which will expose etch stop layer 80 as depicted in FIG. 11. Layers 104 and 102 can be etched using an etch as described above to etch the first conductive conformal layer, which, after optimizing the etch time, will spacer etch layers 104 and 102 to result in the FIG. 11 structure. Layer 104 protects the majority of the vertically-oriented portions of cell dielectric 102 from exposure to the plasma during etching which can damage the cell dielectric. However, portion 110 of the cell dielectric may be exposed and therefore damaged during the spacer etch of layers 104 and 102, but portion 110 will be removed during subsequent processing.

Figure 12:
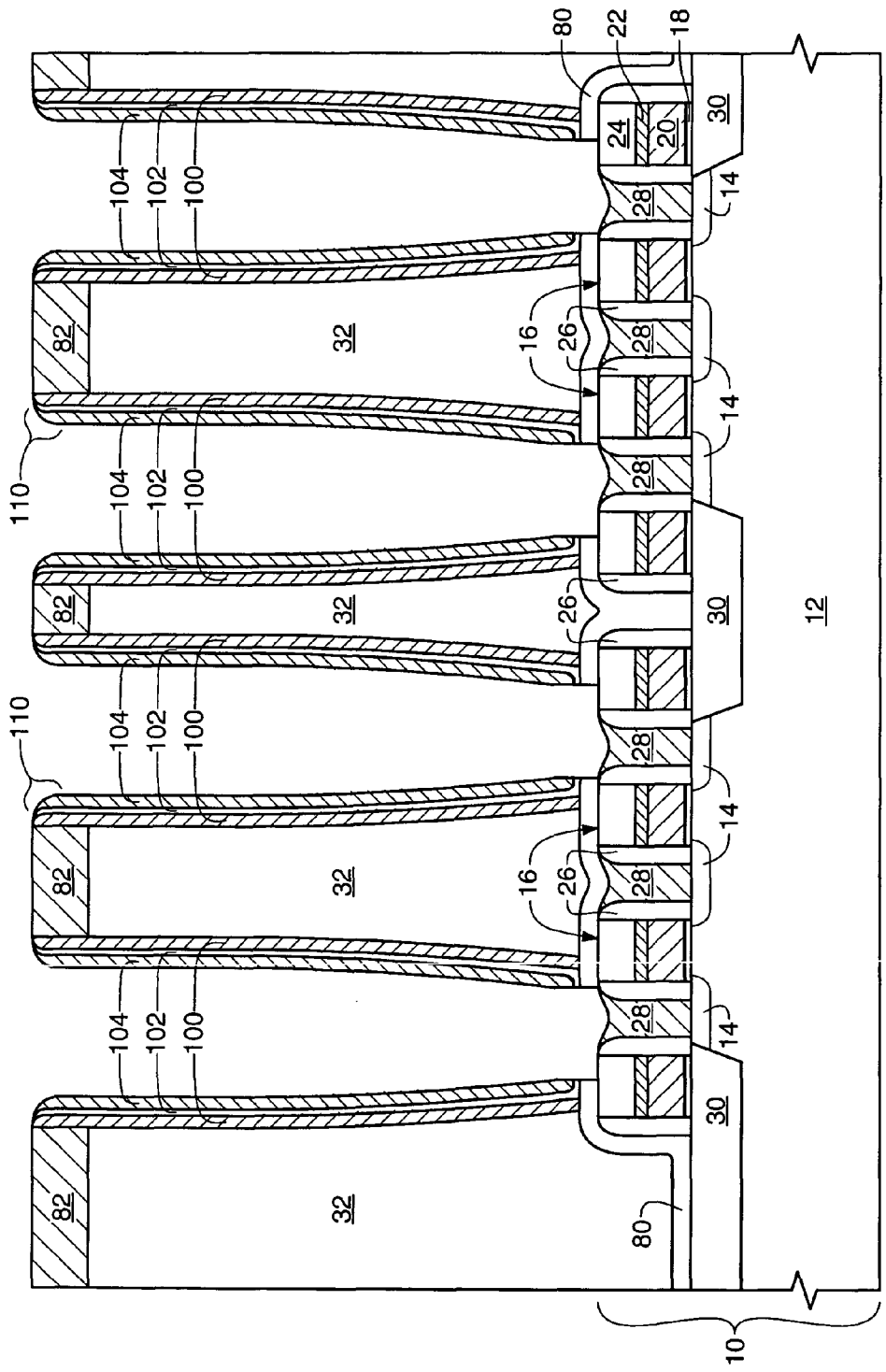

After spacer etching layers 104 and 102 to form the spacers of FIG. 11, silicon nitride etch stop layer 80 is etched to expose contact pads 28 as depicted in FIG. 12.

Subsequent to forming the FIG. 12 structure, another conformal conductive layer 130 is formed over the FIG. 12 structure. This layer can be a third titanium nitride layer, for example between about 50 Å thick to about 100 Å thick, formed according to the process used during the formation of the first titanium nitride layer described above. Layer 130 is formed to be electrically coupled with contact pads 28 through physical contact therewith as depicted in FIG. 13.

After forming the third conductive conformal layer 130, a protective layer 132 is formed. This layer is preferably a photoresist layer, as this layer can be removed selective to the conformal conductive layers, the cell dielectric layers, and polysilicon.

Figure 13:
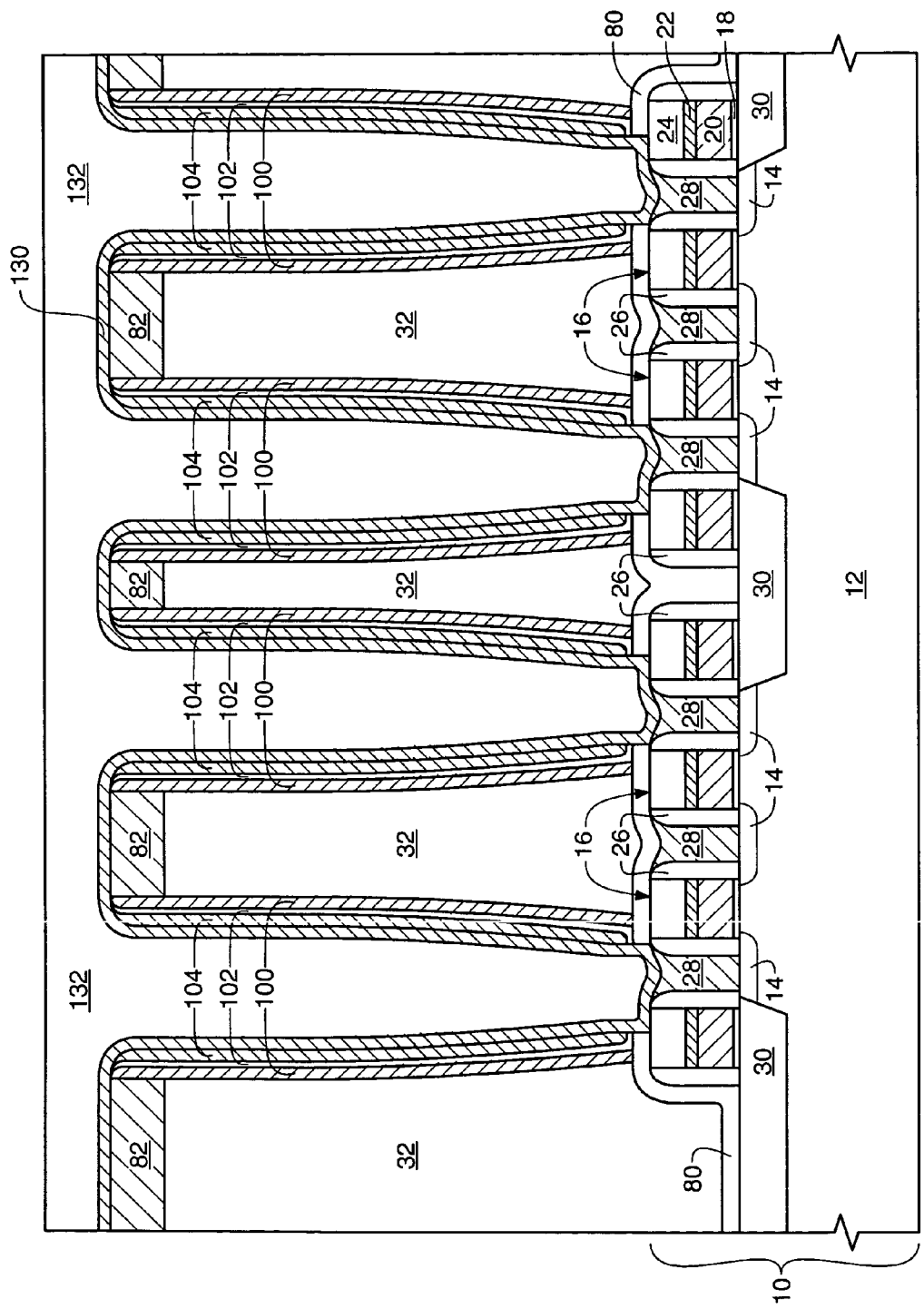
Figure 14:
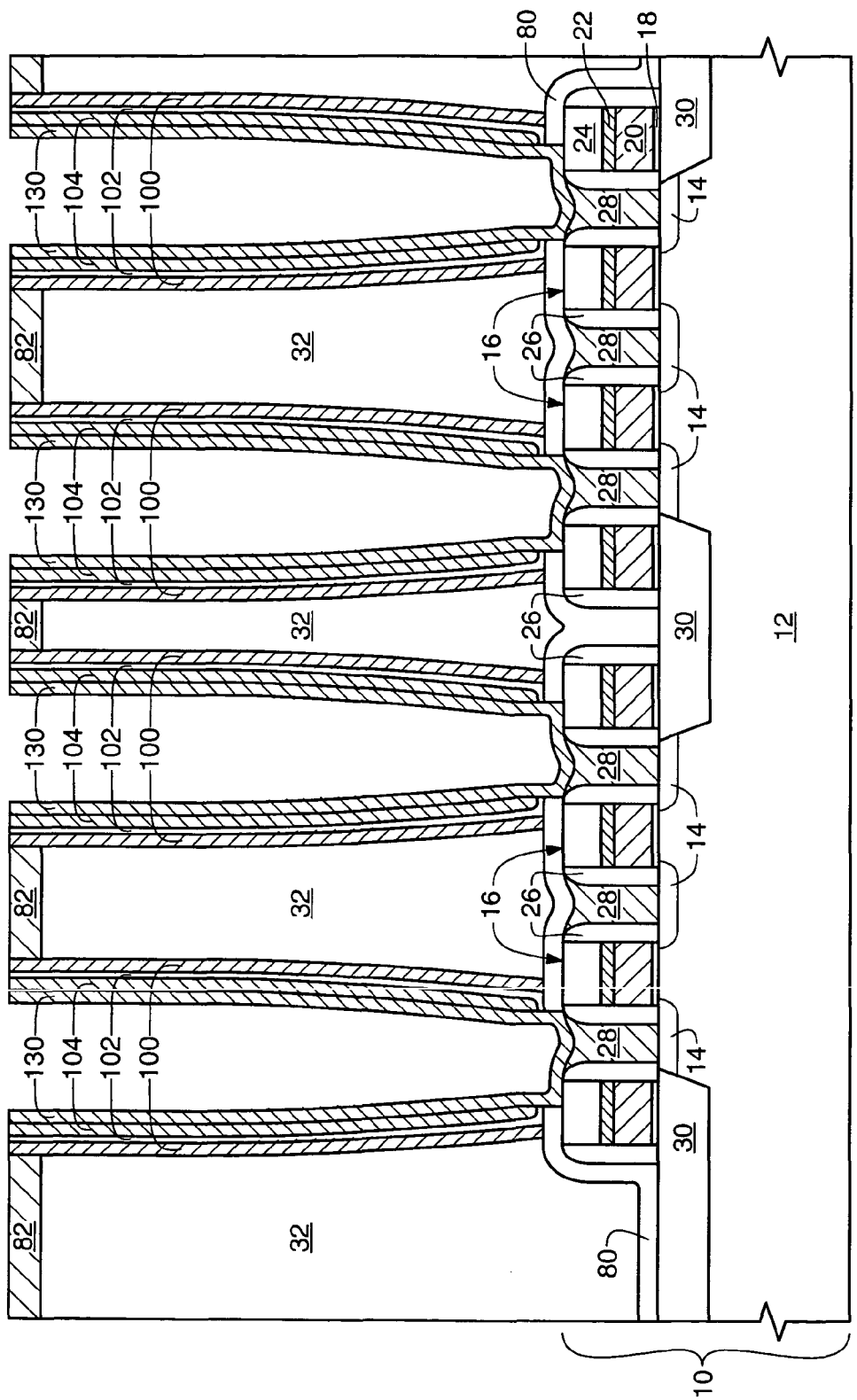

The structure of FIG. 13 is subjected to a planarizing process, for example using a mechanical polishing process such as chemical mechanical polishing (CMP), then layer 132 is removed, for example using a conventional ash process, to result in the structure of FIG. 14. During the planarization process, a portion of layer 82 is removed along with the upper portions of conductive layers 100, 104, and 130, and cell dielectric layer 102. In the present embodiment, conductive polysilicon layer 82 had an initial thickness of between about 2,000 Å and about 4,000 Å as described above, and during the planarization process a sufficient amount of polysilicon is removed to result in a final thickness of between about 500 Å and about 3,500 Å.

(In the alternative process where layer 82 comprises titanium nitride and silicon dioxide, the silicon dioxide is completely removed, and a portion of titanium nitride may be removed, to result in a titanium nitride layer between about 75 Å and about 475 Å.) Sufficient amounts of layers 82, 100, 102, 104, and 130 should be removed to ensure that the titanium nitride layers are electrically isolated, and to remove portion 110 of cell dielectric 104. A portion of conductive layer 82 must remain to allow electrical connection to conductive layer 100 through layer 82 as described later in this document.

Figure 15:
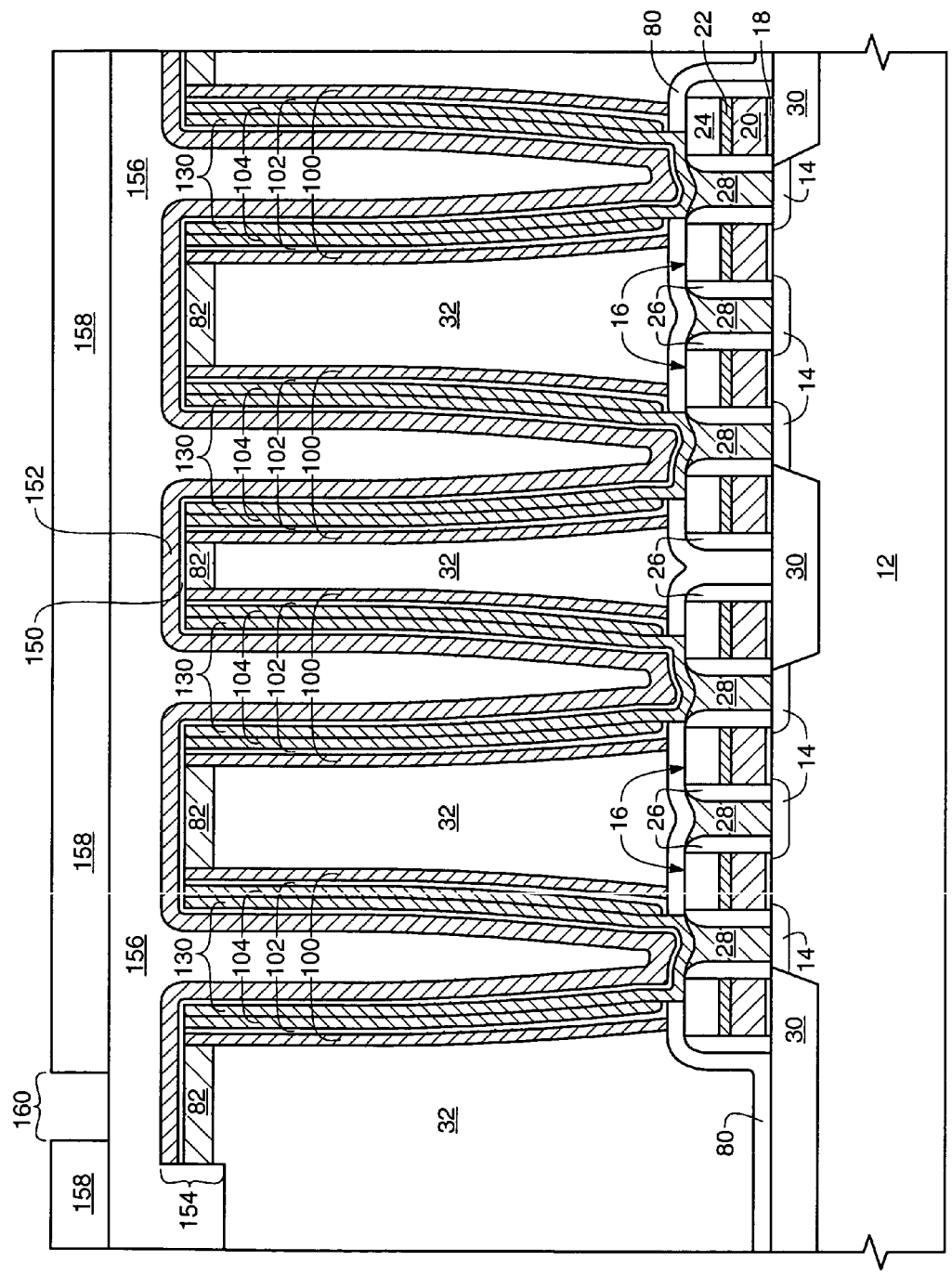

After forming the FIG. 14 structure, a second cell dielectric layer 150 and a fourth conformal conductive layer 152 are formed as depicted in FIG. 15. Cell dielectric layer 150 can be formed from $Al_2O_3$ between about 40 Å and about 60 Å thick using a process as described for the first cell dielectric layer 102. The fourth conformal conductive layer 152, which will form part of the capacitor top plate, can be formed from titanium nitride between about 100 Å to about 200 Å using a process as described above for the first conductive conformal layer 100. After forming layers 150 and 152, a mask is formed to define the top cell plate layer 152, which forms an edge 154 in a periphery region of each die of a wafer. After this etch a planar dielectric layer 156 is formed, for example from borophosphosilicate glass (BPSG) or some other silicon dioxide or workable dielectric. After forming dielectric layer 156, a patterned mask layer 158 having an opening therein 160 which is over the fourth conformal conductive layer 152 and conductive layer 82.

Figure 16:
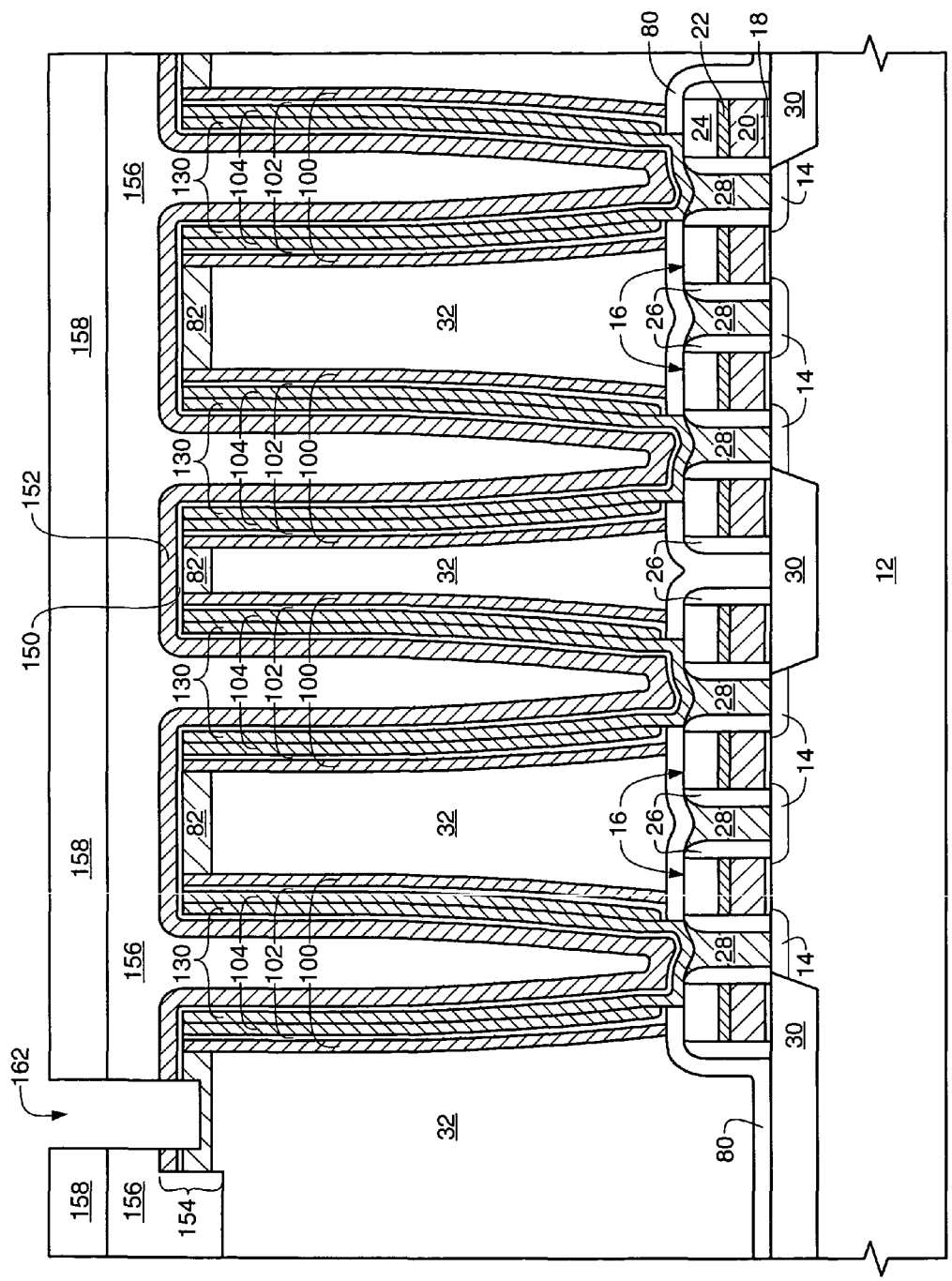

The FIG. 15 structure is subjected to an etch which removes the exposed oxide 156, fourth titanium nitride 152, second cell dielectric 150, and at least exposes conductive layer 82, and preferably etches a portion of conductive layer 82 as depicted in FIG. 16. Etching at least partially into layer 82 maximizes the surface area of contact between layer 82 and a plug subsequently formed within opening 162

Figure 17:
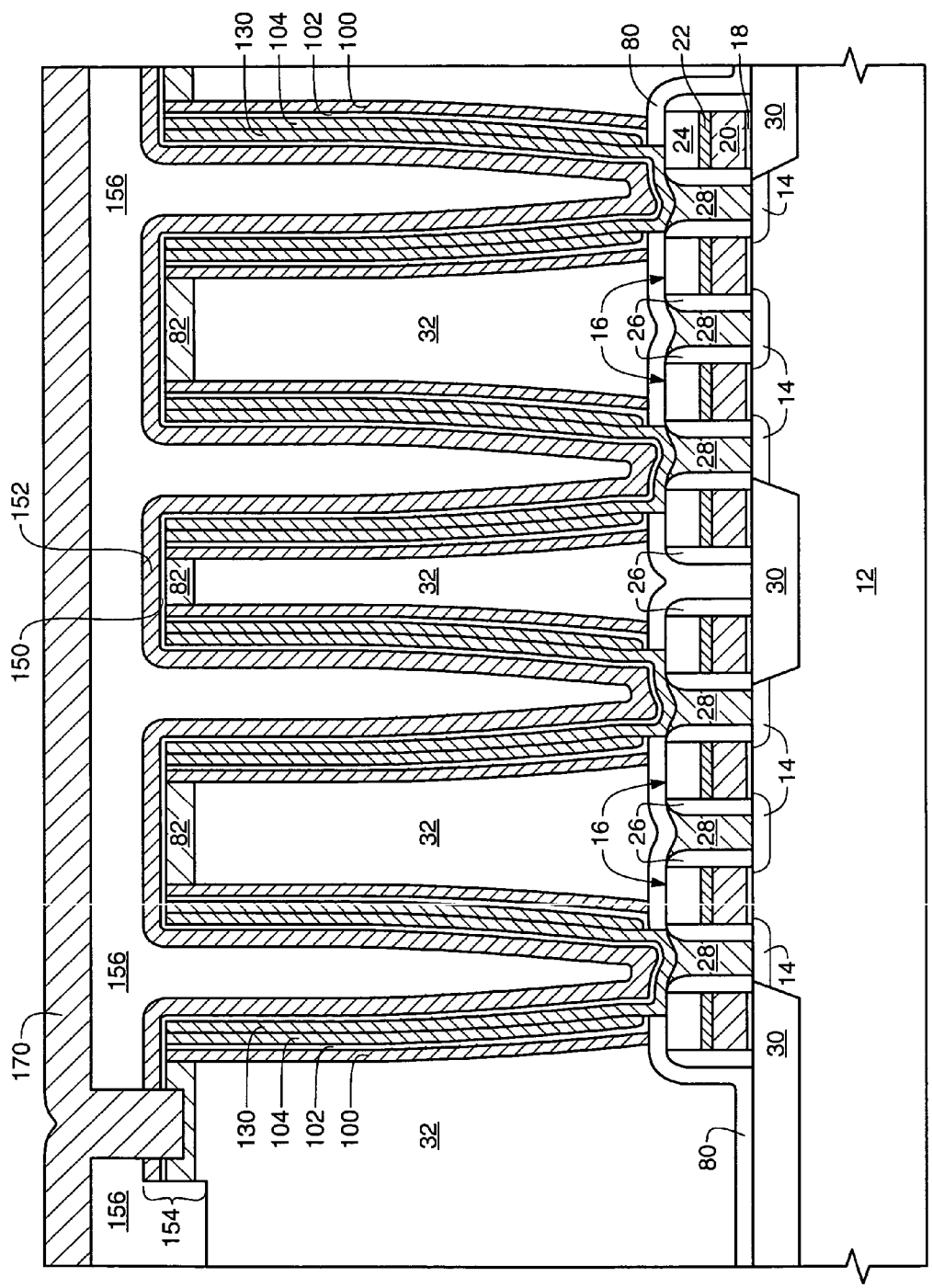

Next, a blanket conductive plug layer 170 such as titanium is formed over the wafer surface as depicted in FIG. 17, which is then planarized, for example using mechanical polishing such as CMP. This results in the FIG. 18 structure comprising conductive plug 180. Plug 180 electrically connects the first capacitor top plate layer 100 with the second capacitor top plate layer 152.

Figure 18:
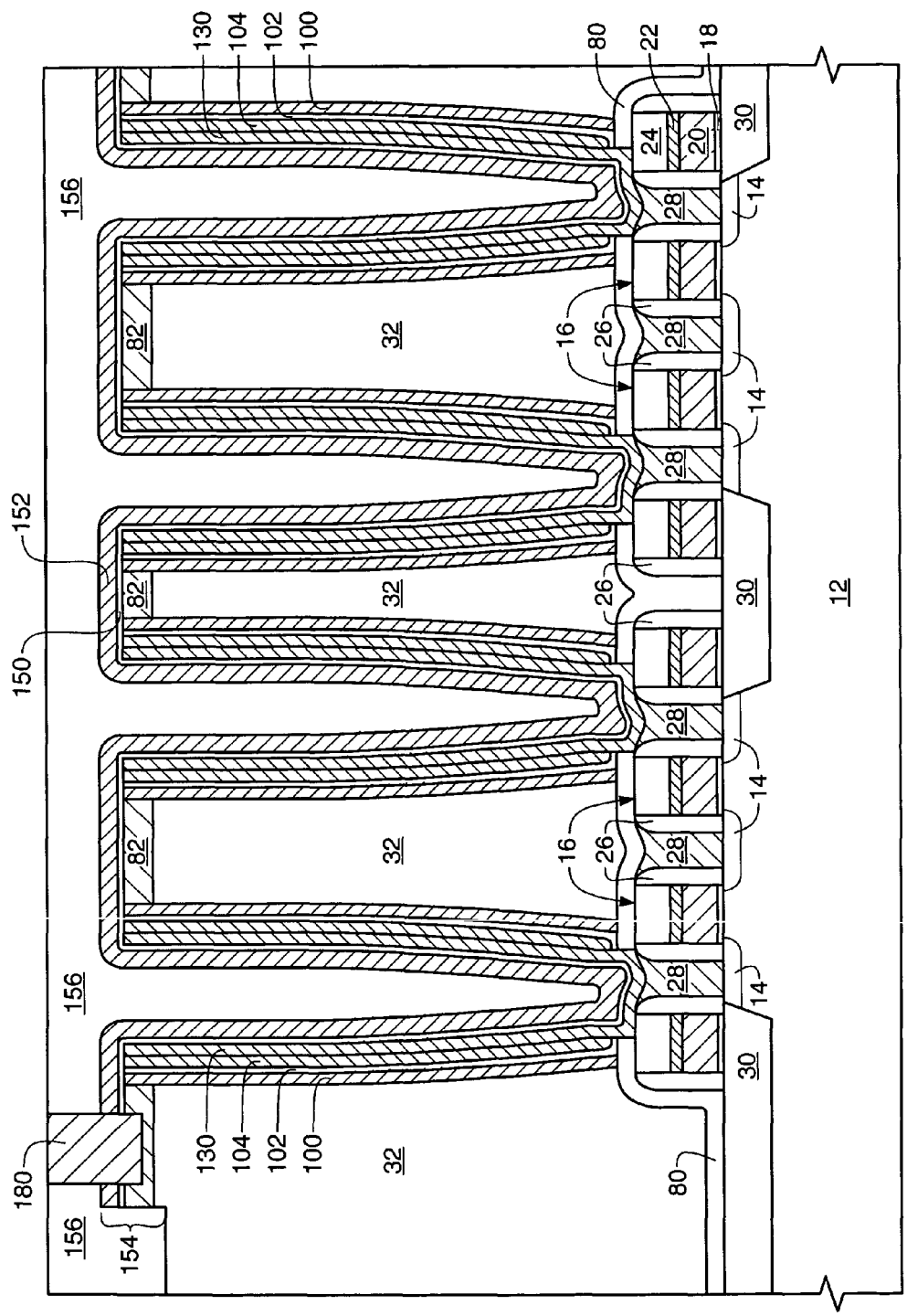

While the two dimensional cross section of FIG. 18 depicts separate portions of conductive layer 82, it is readily appreciated by one of ordinary skill in the art that each individual portion of conductive layer 82 is electrically continuous with all other portions of layer 82. This results from layer 82 being only partially etched during the CMP of the FIG. 13 structure. Thus conductive plug 180, which resides in the periphery of the device, electrically connects top plate layer 100 of all capacitors in the array with top plate layer 152. Similarly, it will be appreciated that the CMP of the FIG. 13 structure electrically isolates bottom plate layer 130 in each container capacitor from bottom plates of adjacent capacitors.

In a preferred embodiment, plug 180 is masked and etched during formation of digit (bit) line contacts (not depicted) elsewhere on the device. This embodiment allows formation of plug 180 without requiring additional masking steps beyond those conventionally required to form digit line contact plugs.

Figure 19:
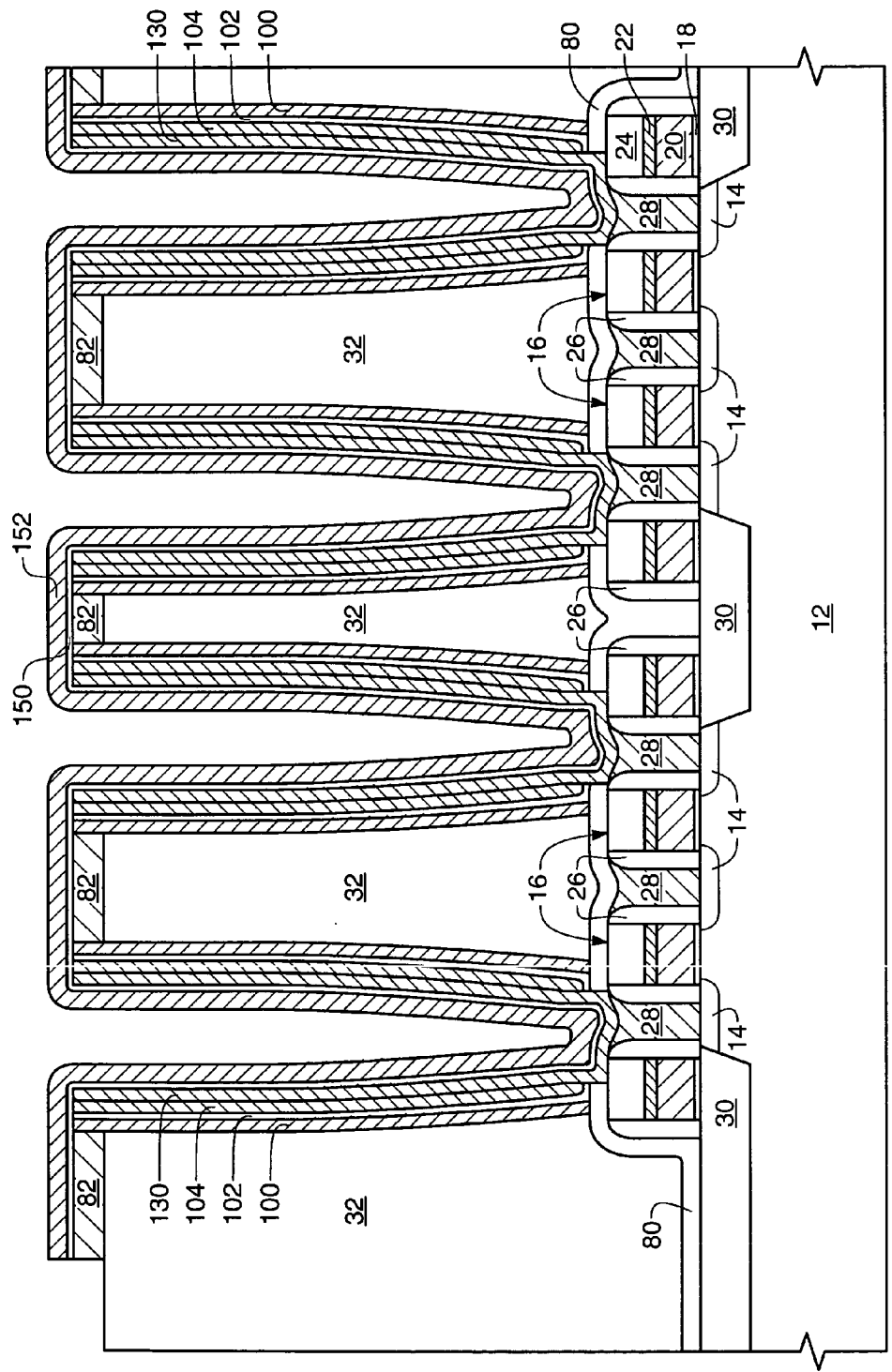
Figure 20:
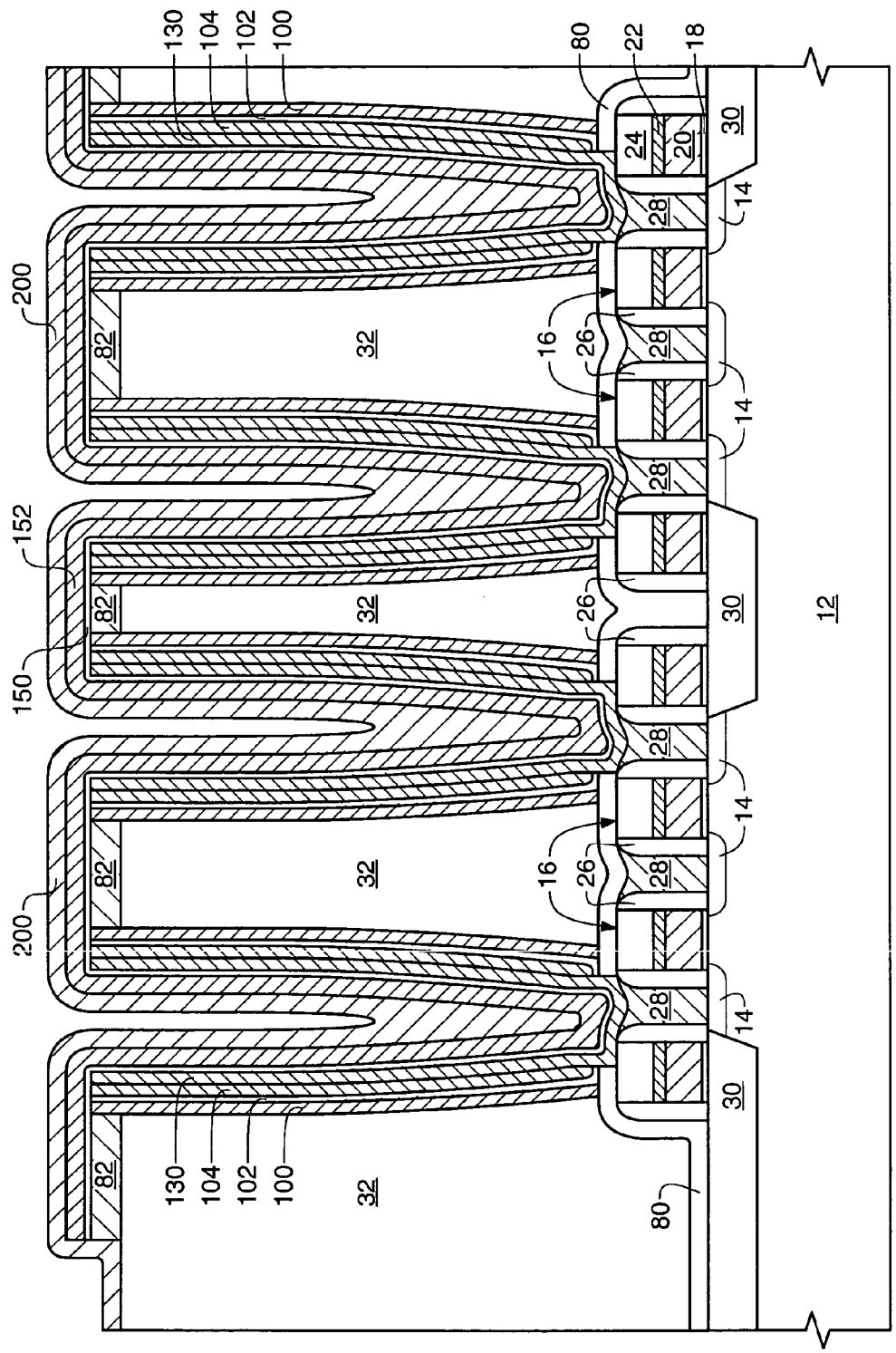
Figure 21:
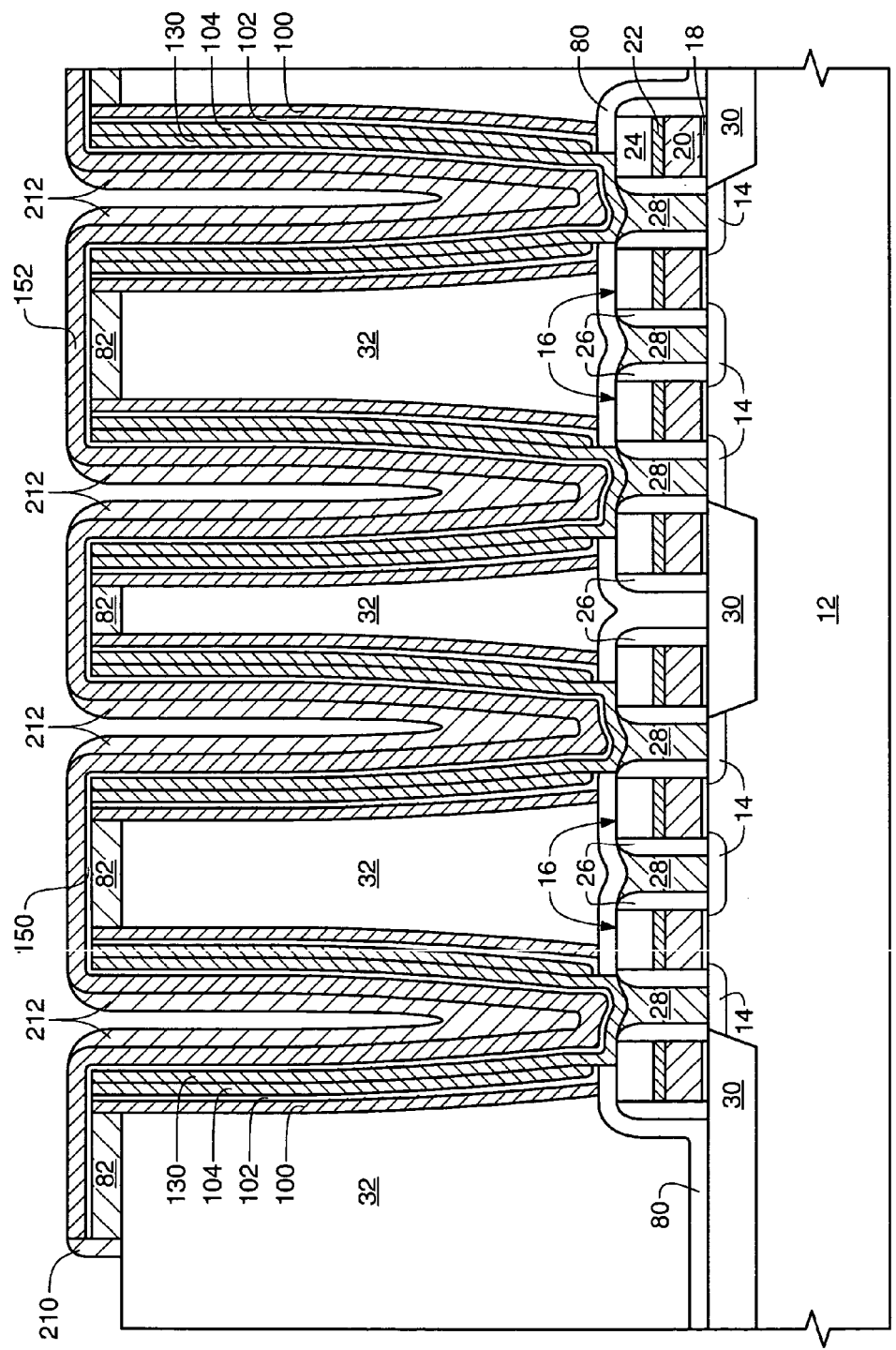

If plug 180 is not desirable, for example because it results in excessive resistance in the contact between the first capacitor top plate layer 100 and the second capacitor top plate layer 152 or for some other reason, these plugs can be replaced by the conductive spacers of a second embodiment depicted in FIGS. 19–21. This structure is formed according to the FIG. 15 structure, except that dielectric layer 156 and mask layer 158 of FIG. 15 are not formed. After providing the FIG. 19 structure, a fifth conductive conformal layer 200, such as a titanium nitride layer, a conductively-doped polysilicon layer, a tungsten layer, a tungsten silicide layer, or a titanium nitride layer having a thickness of between about 100 Å and about 200 Å is formed as depicted in FIG. 20. A spacer etch is performed which results in the structure of FIG. 21 comprising conductive spacers 210, 212. Conductive spacer 210 electrically connects layers 100 and 152 together around the entire perimeter of the top cell plate 152, and thus resistance may be greatly reduced over the embodiment of FIG. 18. While spacers 212 may remain, these conductive features will not adversely affect the functionality of the completed device because of the point in the process at which they are formed. For example, spacers 212 will not form stringers at other device locations which may undesirably short two structures together. Spacers 212 may be bridged at the bottom of the opening as depicted in FIG. 21, or they may be separated to form two separate cross-sectional spacers.

Figure 7:
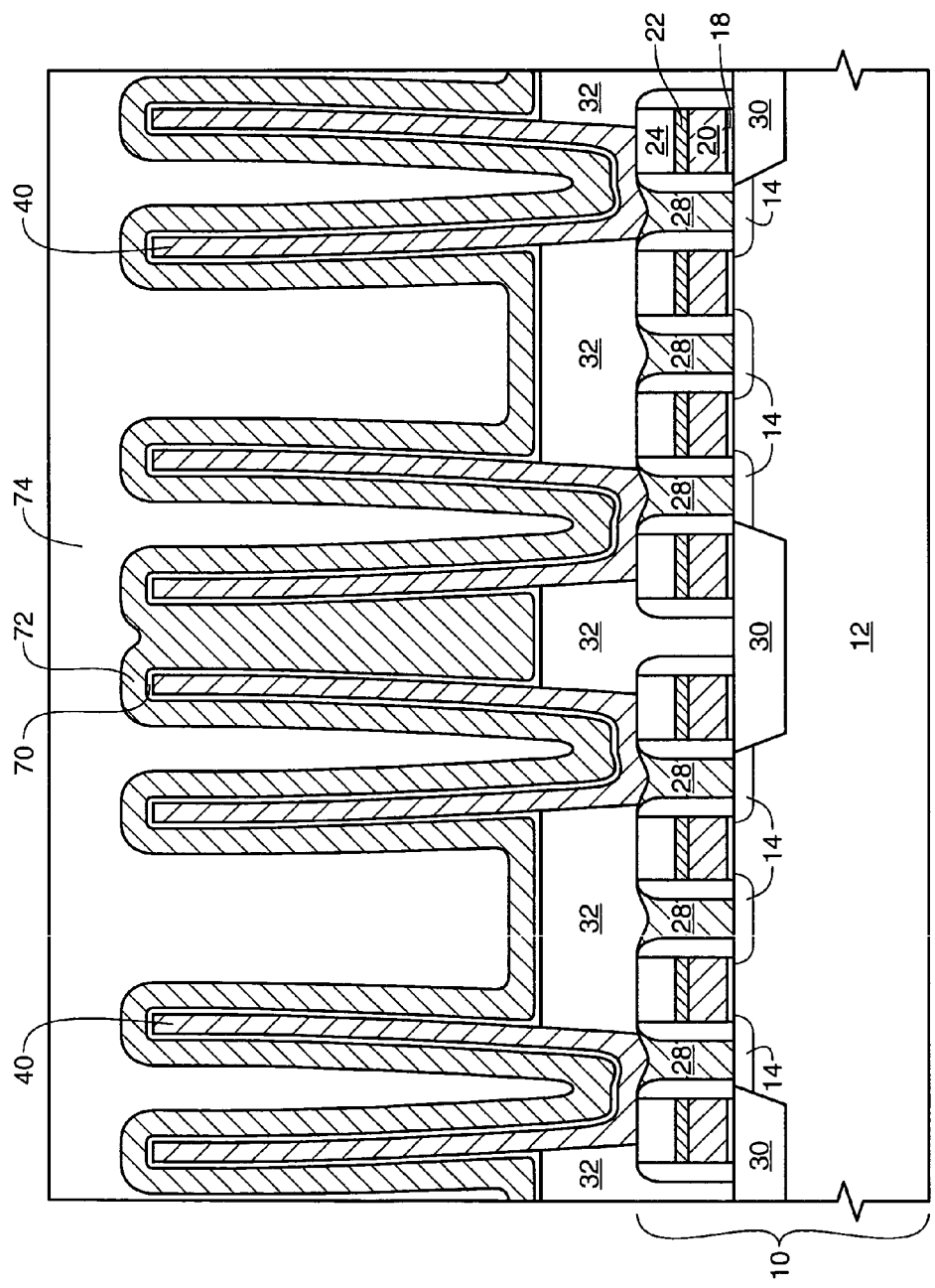

A comparison of the structures of FIGS. 7 and 21 reveals a number of differences between a conventional double-sided capacitor and the double-sided capacitor structure of FIG. 21. For example, with the FIG. 7 structure the capacitor bottom plate 40 is provided by a single polysilicon layer, while the bottom plate of the FIG. 21 structure comprises conductive layers 104 and 130. Further, the bottom plate 40 of FIG. 7 contacts dielectric 32 and the top plate 72 is separated from layer 32 by the capacitor dielectric 70, while with the FIG. 21 structure the top plate 100 contacts layer 32. Additionally, the top plate 72 of FIG. 7 is formed from a single polysilicon layer, while the top plate of the present structure comprises layers 82, 100, and 152, and further one of layers 210 (FIG. 21) or 180 (FIG. 18). Also, the cell dielectric 70 of FIG. 7 is formed from a single layer, while the cell dielectric of FIG. 21 comprises layers 102 and 150. Various other differences can be determined by one of ordinary skill in the art.

As can be seen from the embodiments depicted, the inventive process results in the formation of a double sided container capacitor without requiring removal of oxide 32 between capacitors at some point in the process flow, for example after forming the capacitor bottom plate layer. After the initial etch of oxide 32 to form the FIG. 8 structure, etching oxide 32 is not required during formation of the top and bottom plates and the cell dielectric.

Figure 22:
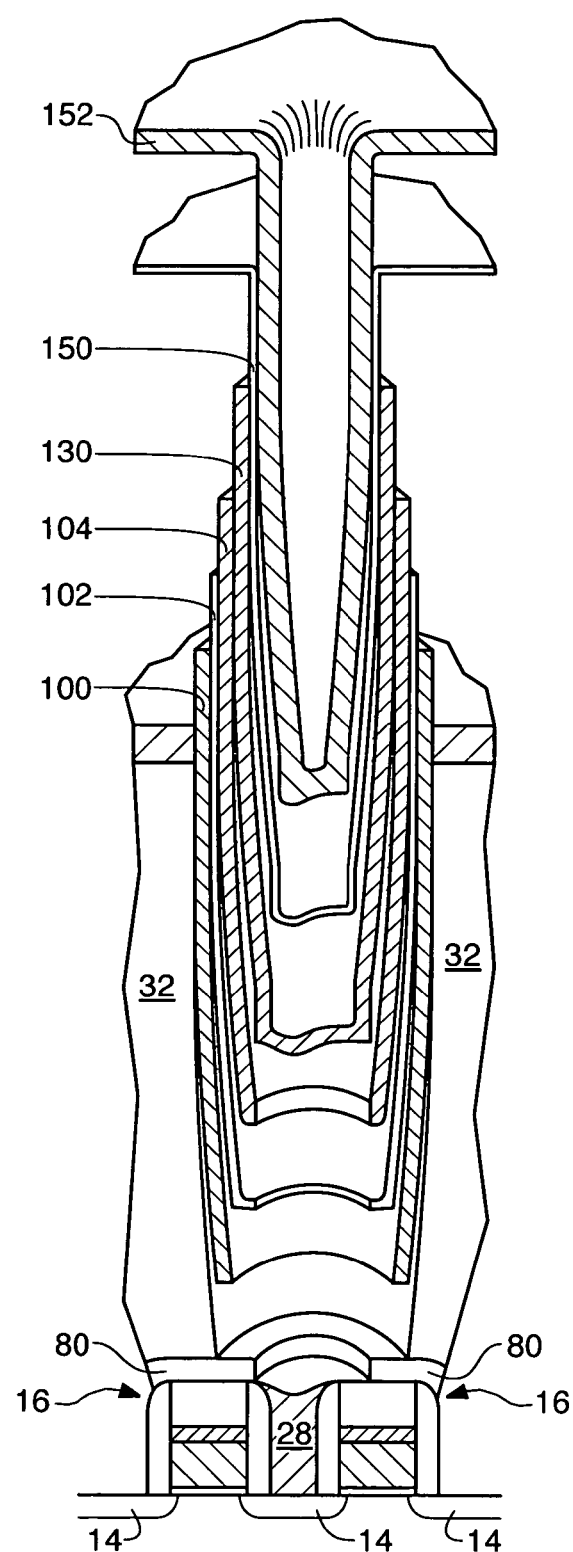
FIG. 22 is an isometric depiction of an embodiment of the container capacitor structure.

FIG. 22 is an isometric depiction of an embodiment of the inventive device comprising a number of structures, each having a cylindrical shape comprising internal surface and an external surface. FIG. 22 depicts a first capacitor top plate layer 100, a first cell dielectric layer 102, a first capacitor bottom plate layer 104, a second capacitor bottom plate layer 130, a second cell dielectric layer 150, and a second capacitor top plate layer 152. The external surface of the first cell dielectric layer 102 contacts the internal surface of the first capacitor top plate layer 100, the external surface of the first capacitor bottom plate layer 104 contacts the internal surface of the first cell dielectric layer 102, the external surface of the second capacitor bottom plate layer 130 contacts the internal surface of the first capacitor bottom plate layer 104, the external surface of the second cell dielectric layer 150 contacts the internal surface of the second capacitor bottom plate layer 130, and the external surface of the second capacitor top plate layer 152 contacts the internal surface of the second cell dielectric layer 150.

Figure 23:
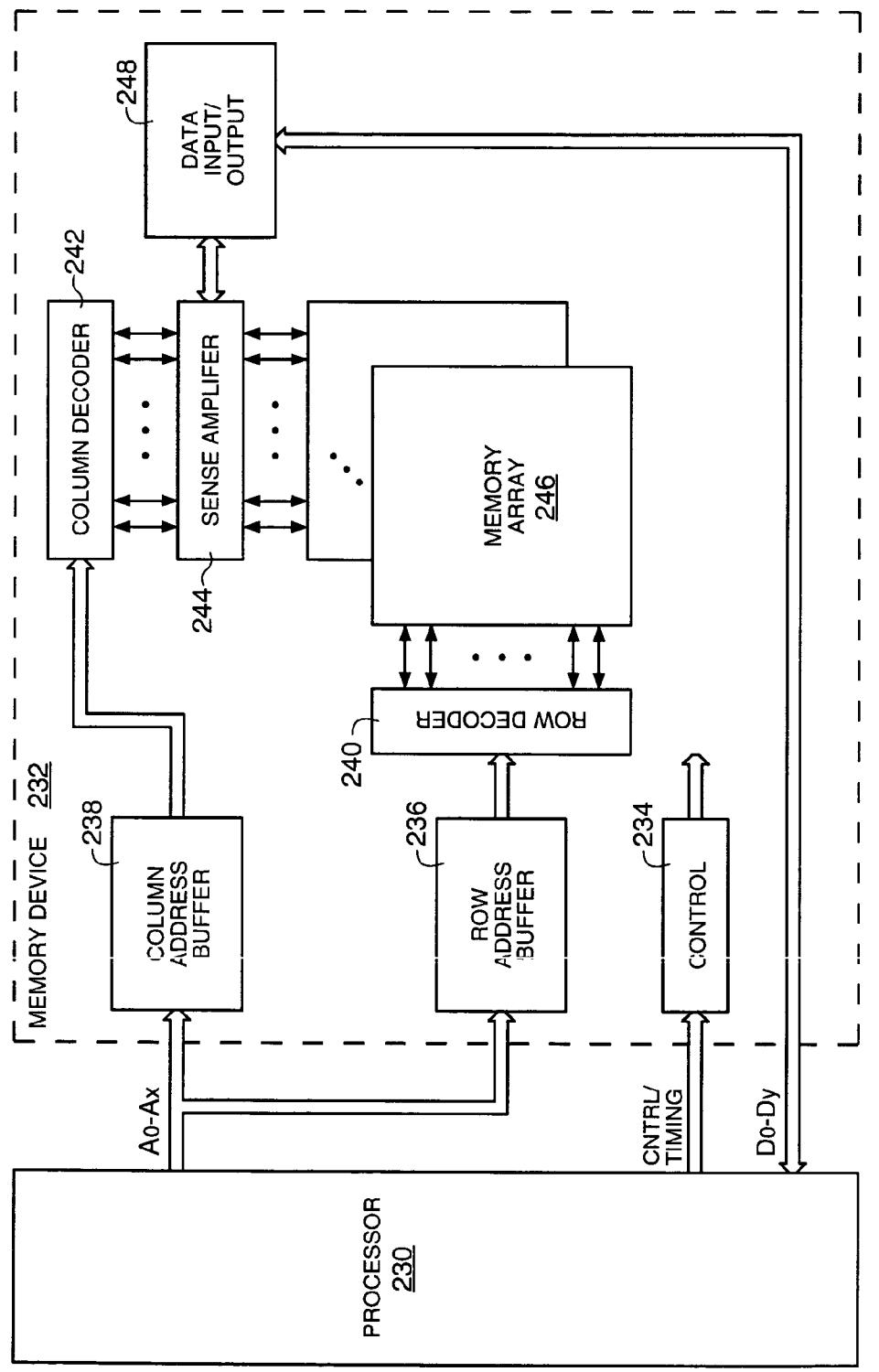
FIG. 23 is a block diagram of an exemplary use of the invention as a memory array in a dynamic random access memory.

The process and structure described herein can be used to manufacture a number of different structures which comprise a container capacitor. FIG. 23, for example, is a simplified block diagram of a memory device such as a dynamic random access memory having a memory array with container capacitors which may be formed using an embodiment of the present invention. The general operation of such a device is known to one skilled in the art. FIG. 23 depicts a processor 230 coupled to a memory device 232, and further depicts the following basic sections of a memory integrated circuit: control circuitry 234; row 236 and column 238 address buffers; row 240 and column 242 decoders; sense amplifiers 244; memory array 246; and data input/output 248.

Figure 24:
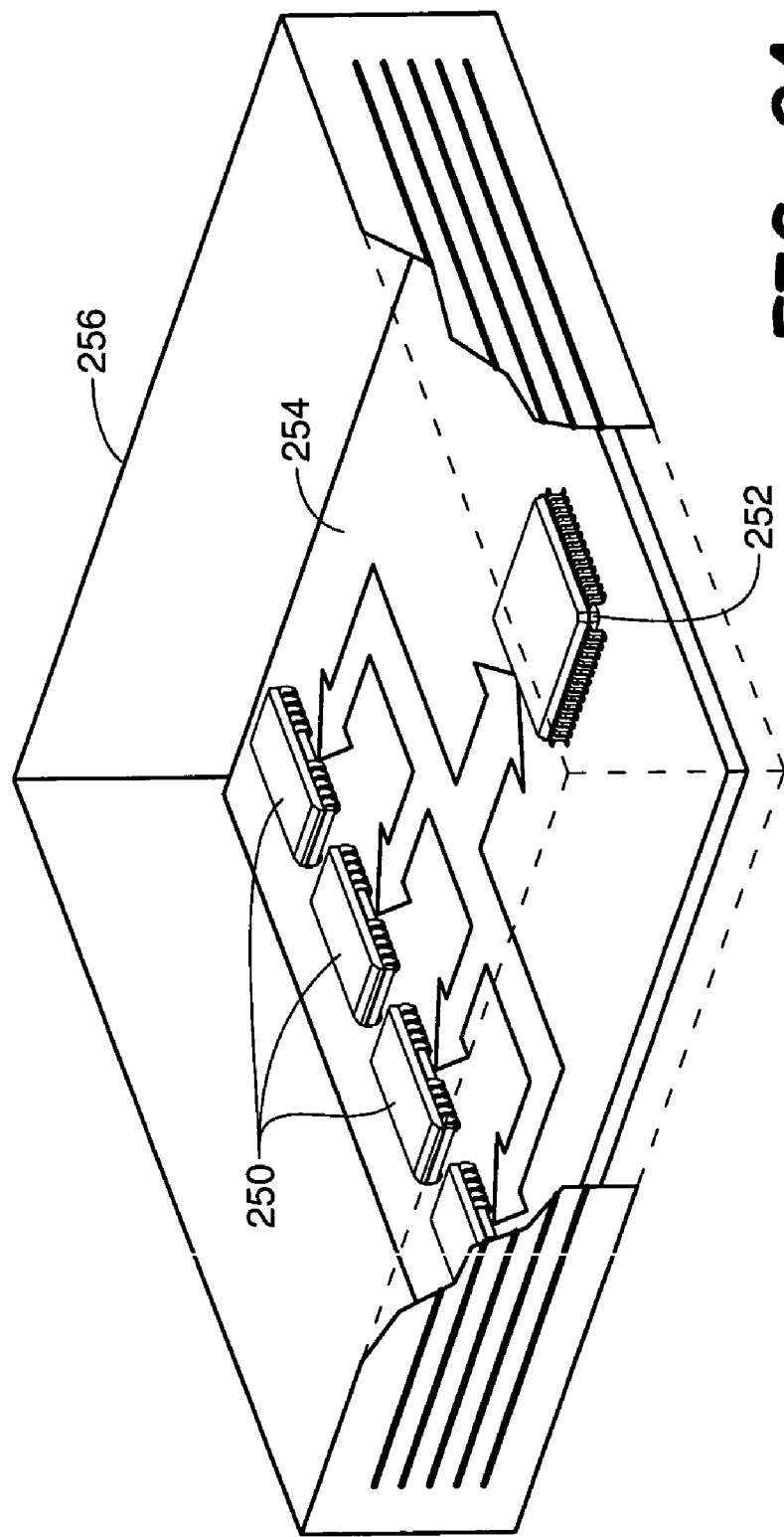
FIG. 24 is an isometric depiction of a use of the invention in an electronic device.

As depicted in FIG. 24, a semiconductor device 250 formed in accordance with the invention may be attached along with other devices such as a microprocessor 252 to a printed circuit board 254, for example to a computer motherboard or as a part of a memory module used in a personal computer, a minicomputer, or a mainframe 256. FIG. 24 may also represent use of device 250 in other electronic devices comprising a housing 256, for example devices comprising a microprocessor 252, related to telecommunications, the automobile industry, semiconductor test and manufacturing equipment, consumer electronics, or virtually any piece of consumer or industrial electronic equipment.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein.

What is claimed is:

1. A method for forming a semiconductor device capacitor, comprising:

providing a base dielectric layer;

etching said base dielectric layer to form an opening therein, said opening defined by first and second cross-sectional dielectric sidewalls;

forming a first conductive cross-sectional spacer on said first dielectric sidewall wherein said first conductive spacer forms a portion of a capacitor top plate;

forming a first capacitor cell dielectric layer on said first conductive spacer;

forming a second conductive cross-sectional spacer on said first capacitor cell dielectric layer;

forming a first conductive layer on said second conductive spacer, wherein said second conductive spacer and said conductive layer each form a portion of a capacitor bottom plate;

forming a second cell dielectric layer on said first conductive layer;

forming a second conductive layer on said second cell dielectric layer, wherein said second conductive layer forms a portion of said capacitor top plate; and forming a conductive feature which electrically connects said first conductive spacer and said second conductive layer.

2. The method of claim 1, further comprising:
prior to etching said base dielectric layer, forming a third conductive layer over a planarized surface of said base dielectric layer;
during said etching of said base dielectric layer to form said opening, etching said third conductive layer to form an opening in said third conductive layer;
forming said first conductive cross-sectional spacer to contact said third conductive layer;
performing an etch which forms a cross-sectional third sidewall from said second conductive layer, said second cell dielectric layer, and said third conductive layer; and
during said formation of said conductive feature:
forming a conformal fourth conductive layer which contacts said second conductive layer and said third conductive layer;
spacer etching said forth conductive layer which forms a third conductive cross-sectional spacer on said third sidewall and electrically connects said first conductive spacer and said second conductive layer through said third conductive layer.

3. The method of claim 2 further comprising forming fourth and fifth conductive cross-sectional spacers from said fourth conductive layer within said opening in said base dielectric layer during said spacer etch of said fourth conductive layer.

4. The method of claim 2 further comprising removing at least a portion of said third conductive layer using a planarizing process prior to forming said second cell dielectric layer.

5. The method of claim 4 further comprising removing a portion of each of said first conductive cross-sectional spacer, said first capacitor cell dielectric layer, said second conductive cross-sectional spacer, and said first conductive layer during said planarizing process.

6. The method of claim 1 further comprising:
prior to etching said base dielectric layer, forming a third conductive layer over a planarized surface of said base dielectric layer;
during said etching of said base dielectric layer to form said opening, etching said third conductive layer to form an opening in said third conductive layer;
forming said first conductive cross-sectional spacer to contact said third conductive layer;
etching said second conductive layer and said second cell dielectric layer to form an opening therein and to expose said third conductive layer;
forming a conductive plug within said opening in said second conductive layer and said second cell dielectric layer, said plug contacting said second conductive layer and said third conductive layer to electrically connect said first conductive spacer and said second conductive layer through said third conductive layer.

7. The method of claim 6 further comprising removing at least a portion of said third conductive layer by a planarizing process prior to forming said second cell dielectric layer.

8. The method of claim 7 further comprising removing a portion of each of said first conductive cross-sectional spacer, said first capacitor cell dielectric layer, said second conductive cross-sectional spacer, and said first conductive layer during said planarizing process.

9. A method used to form a semiconductor device, comprising:

providing a semiconductor wafer substrate assembly comprising a semiconductor wafer and a conductive contact pad overlying said wafer;
forming an etch stop layer on said contact pad;
forming a blanket planarized base dielectric layer on said etch stop layer;
forming a conformal first conductive layer on said planarized base dielectric layer;
etching said conformal first conductive layer and said planarized base dielectric layer to form first and second cross sectional sidewalls in said base dielectric layer which define a recess in said base dielectric layer, wherein said etch exposes said etch stop layer;
forming a second conductive layer which comprises a first conductive spacer on said first sidewall;
forming a first cell dielectric layer on said first conductive spacer and on said etch stop layer;
forming a third conductive layer on said first cell dielectric layer;
spacer etching said third conductive layer and said first cell dielectric layer to form a second conductive spacer from said third conductive layer, to form a cell dielectric spacer from said first cell dielectric layer, and to expose said etch stop layer;
subsequent to said spacer etching said third conductive layer and said first cell dielectric layer, etching said etch stop layer to expose said contact pad;
forming a fourth conductive layer on said second conductive spacer and on said contact pad;
forming a second cell dielectric layer on said fourth conductive layer;
forming a fifth conductive layer on said second cell dielectric layer; and
electrically connecting said first conductive spacer and said fifth conductive layer, wherein said second and fifth conductive layers form a first capacitor plate, and said third and fourth conductive layers form a second capacitor plate interposed between said first conductive spacer and said fifth conductive layer.

10. The method of claim 9 further comprising:
during said formation of said second conductive layer, forming said spacer to contact said first conductive layer;
etching an opening in said second cell dielectric layer and said fifth conductive layer to expose said first conductive layer;
forming a conductive plug within said opening in said fifth conductive layer and said second cell dielectric layer, said plug contacting said first conductive layer and said fifth conductive layer to electrically connect said first conductive spacer and said fifth conductive layer through said first conductive layer.

11. The method of claim 9 further comprising:
performing an etch which forms a third cross-sectional sidewall from said fifth conductive layer, said second cell dielectric layer, and said first conductive layer;
forming a sixth conductive layer over said fifth conductive layer and on said third cross-sectional sidewall; and
spacer etching said sixth conductive layer to form a conductive spacer on said third cross-sectional sidewall which electrically connects said first conductive spacer and said fifth conductive layer.

12. The method of claim 11 further comprising, during said formation of said sixth conductive layer, forming a portion of said sixth conductive layer within said opening in said base dielectric layer, wherein subsequent to spacer etching said sixth conductive layer, a portion of said sixth conductive layer remains in said opening in said base dielectric layer.

13. A method used to form a semiconductor device, comprising:
forming a semiconductor wafer substrate assembly comprising a base supporting layer having a recess therein;
within the recess in the base supporting layer, forming first and second conductive spacers having a first cell dielectric interposed therebetween which electrically isolates the first and second conductive spacers from each other;
forming a first conductive layer electrically connected to the second conductive spacer within the recess;
forming a blanket second conductive layer over the first conductive layer and electrically separated from the first conductive layer by a second cell dielectric layer; and
electrically connecting the first conductive spacer and the blanket second conductive layer to form a storage capacitor, where the first conductive spacer and blanket second conductive layer form a portion of a capacitor top plate and the second conductive spacer and first conductive layer form a portion of a capacitor bottom plate.

14. The method of claim 13 further comprising etching the blanket second conductive layer prior to electrically connecting the first conductive spacer and the blanket second conductive layer.

15. The method of claim 14 further comprising:
during the formation of the base supporting layer:
forming a base dielectric layer and a base conductive layer over the base dielectric layer;
etching the base conductive layer and the base dielectric layer to form the recess in the base supporting layer; and
subsequent to the etching of the blanket second conductive layer, etching the base conductive layer to form a sidewall defined by the blanket second conductive layer and the base conductive layer.

16. The method of claim 15 further comprising forming a third conductive spacer over the sidewall to electrically connect the blanket second conductive layer and the base conductive layer.

17. The method of claim 15 further comprising:
etching the blanket second conductive layer and the base conductive layer to form an opening therein; and
forming a conductive plug within the opening to electrically connect the blanket second conductive layer and the base conductive layer.

18. A method used to form a semiconductor device comprising a storage capacitor having a top plate and a bottom plate, comprising:
forming a first portion of a capacitor top plate comprising a vertically-oriented conductive spacer;
forming a first cell dielectric layer to contact the first portion of the capacitor top plate;
forming a first portion of a capacitor bottom plate comprising a vertically-oriented conductive spacer to contact the first cell dielectric layer;
forming a second portion of the capacitor bottom plate comprising a vertically-oriented layer to contact the first portion of the capacitor bottom plate;
forming a second cell dielectric layer to contact the second portion of the capacitor bottom plate;
forming a second portion of the capacitor top plate to contact the second cell dielectric layer and which comprises a portion which overlies the first portion of the capacitor top plate, the first and second cell dielectric layers, and the first and second portions of the capacitor bottom plate; and
forming a conductive structure which electrically connects the first and second capacitor top plate portions.

19. The method of claim 18 wherein the formation of the conductive structure which electrically connects the first and second capacitor top plate portions comprises:
etching the first and second capacitor top plate portions to form a sidewall comprising the first and second capacitor top plate portions;
forming a blanket conductive layer on the sidewall;
etching the blanket conductive layer to form a conductive spacer which contacts the sidewall and electrically connects the first and second capacitor top plate portions.

20. The method of claim 18 wherein the formation of the conductive structure which electrically connects the first and second capacitor top plate portions comprises:
etching the first and second capacitor top plate portions to form an opening in the first and second capacitor top plate portions; and
forming a conductive plug within the opening in the first and second capacitor top plate portions.

21. The method of claim 18 further comprising:
providing a semiconductor wafer substrate assembly comprising a semiconductor wafer having a conductively-doped region therein;
forming a conductive pad to contact the conductively-doped region of the semiconductor wafer;
during the formation of the first portion of the capacitor bottom plate:
forming a blanket conductive bottom plate layer; and
spacer etching the blanket conductive bottom plate layer to form the first portion of the capacitor bottom plate having an opening therein whereby the conductive pad is exposed through the opening in a bottom of the bottom plate layer; and
forming the second portion of the capacitor bottom plate to contact the first portion of the capacitor bottom plate layer and the conductive pad through the opening in the first portion of the bottom plate layer.

* * * * *